(12) United States Patent
Park et al.

(10) Patent No.: US 11,855,236 B2
(45) Date of Patent: *Dec. 26, 2023

(54) SENSORS AND ELECTRONIC DEVICES

(71) Applicant: Samsung Electronics Co., Ltd., Suwon-si (KR)

(72) Inventors: Kyung Bae Park, Hwaseong-si (KR); Sung Jun Park, Yongin-si (KR); Feifei Fang, Suwon-si (KR); Sung Young Yun, Suwon-si (KR); Seon-Jeong Lim, Yongin-si (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/151,770

(22) Filed: Jan. 9, 2023

(65) Prior Publication Data

US 2023/0163230 A1 May 25, 2023

Related U.S. Application Data

(63) Continuation of application No. 17/306,271, filed on May 3, 2021, now Pat. No. 11,552,212.

(30) Foreign Application Priority Data

May 11, 2020 (KR) .................. 10-2020-0056122

(51) Int. Cl.
*H01L 31/112* (2006.01)
*H01L 31/0224* (2006.01)
*H01L 31/0256* (2006.01)

(52) U.S. Cl.
CPC ...... *H01L 31/1121* (2013.01); *H01L 31/0256* (2013.01); *H01L 31/022408* (2013.01)

(58) Field of Classification Search
CPC ......... H01L 31/1121; H01L 31/022408; H01L 31/0256; H01L 27/307; H01L 27/14667;
(Continued)

(56) References Cited

U.S. PATENT DOCUMENTS 6,914,631 B2 7/2005 Udo et al.
7,045,833 B2 5/2006 Campbell et al.
(Continued)

FOREIGN PATENT DOCUMENTS

CN 101197425 B 11/2010
JP 3734717 B2 1/2006
(Continued)

OTHER PUBLICATIONS

Li L, Zhang F, Wang J, An Q, Sun Q, Wang W, Zhang J, Teng F. Achieving EQE of 16,700% in P3HT:PC71BM based photodetectors by trap-assisted photomultiplication. Sci Rep. Mar. 17, 2015;5:9181. doi: 10.1038/srep09181. PMID: 25777148; PMCID: PMC4361887 (Year: 2015).*

(Continued)

*Primary Examiner* — Sitaramarao S Yechuri
(74) *Attorney, Agent, or Firm* — Harness, Dickey & Pierce, P.L.C.

(57) ABSTRACT

A sensor includes a first electrode and a second electrode, and a photo-active layer between the first electrode and the second electrode. The photo-active layer includes a light absorbing semiconductor configured to form a Schottky junction with the first electrode. The photo-active layer has a charge carrier trapping site configured to capture photogenerated charge carriers generated based on the light absorbing semiconductor absorbing incident light that enters at least the photo-active layer at a position adjacent to the first electrode. The sensor is configured to have an external quantum efficiency (EQE) that is adjusted based on a voltage (Continued)

bias being applied between the first electrode and the second electrode.

18 Claims, 18 Drawing Sheets

(58) Field of Classification Search
CPC ......... H01L 27/14621; H01L 27/14645; H01L 27/14669; H01L 51/4213; H01L 51/441; H01L 51/4206; H01L 51/447; H04N 5/2257

See application file for complete search history.

(56) References Cited

U.S. PATENT DOCUMENTS

| | | | |
|---|---|---|---|
| 8,618,460 | B2 | 12/2013 | Kuboi |
| 8,822,897 | B2 | 9/2014 | Tian et al. |
| 8,829,410 | B2 | 9/2014 | Kuboi |
| 9,293,487 | B2 | 3/2016 | Tian et al. |
| 9,466,747 | B1 | 10/2016 | Farrell et al. |
| 9,666,634 | B2 | 5/2017 | Tian et al. |
| 9,780,130 | B2 | 10/2017 | Suh et al. |
| 9,887,318 | B2 | 2/2018 | Titov et al. |
| 9,972,653 | B2 | 5/2018 | Tian et al. |
| 10,084,103 | B1* | 9/2018 | Lewis ............. H01L 31/035218 |
| 10,293,326 | B2 | 5/2019 | Park et al. |
| 10,332,921 | B2 | 6/2019 | Miura et al. |
| 10,535,699 | B2 | 1/2020 | Tian et al. |
| 2005/0072462 | A1* | 4/2005 | Kang ................... H01G 9/2009 136/263 |
| 2009/0239330 | A1* | 9/2009 | Vanheusden .... H01L 31/022425 438/98 |
| 2012/0067410 | A1 | 3/2012 | Matsuki et al. |
| 2012/0241003 | A1* | 9/2012 | Wachi ................... H10K 30/353 136/263 |
| 2015/0311258 | A1* | 10/2015 | Kim ...................... H01L 27/307 257/40 |
| 2017/0077429 | A1* | 3/2017 | Huang .................. H01L 51/426 |
| 2018/0158985 | A1 | 6/2018 | Titov et al. |
| 2020/0058944 | A1* | 2/2020 | Song ................... H01M 4/8673 |
| 2020/0328366 | A1* | 10/2020 | Layton ................. H10K 30/00 |

FOREIGN PATENT DOCUMENTS

| | | |
|---|---|---|
| JP | 2012-049289 A | 3/2012 |
| JP | 5540323 B2 | 7/2014 |
| JP | 5688646 B2 | 3/2015 |
| JP | 2018-006375 A | 1/2018 |
| KR | 2013-0018684 A | 2/2013 |
| KR | 2013-0058675 A | 6/2013 |
| KR | 2015-0145934 A | 12/2015 |
| KR | 2016-0034345 A | 3/2016 |
| KR | 2016-0102394 A | 8/2016 |
| KR | 10-1895538 B1 | 9/2018 |
| KR | 2019-0115646 A | 10/2019 |

OTHER PUBLICATIONS

R. Clerc, J. Vaillant and L. Hirsch, "Device modeling of solution-processed organic solar cells, photodiodes and photo-resistances Invited paper," 2018 48th European Solid-State Device Research Conference (ESSDERC), Dresden, Germany, 2018, pp. 198-201, doi: 10.1109/ESSDERC.2018.8486880 (Year: 2018).*

Pont, S., Foglia, F., Higgins, A. M., Durrant, J. R., Cabral, J. T., Adv. Funct. Mater. 2018, 28, 1802520. https://doi.org/10.1002/adfm.201802520 (Year: 2018).*

Lingliang Li et al., "Achieving EQE of 16,700% in P3HT: PC71BM based photodetectors by trap-assisted photomultiplication" Scientific Reports (Mar. 17, 2015), pp. 1-7.

Deepan Kumar Neethipathi et al., "High-Performance Photomultiplication Photodiode with a 70nm-Thick Active Layer Assisted by IDIC as an Efficient Molecular Sensitizer" American Chemical Society (2019) 21211-21217.

Wenyan Wang et al., "Effect of photogenerated carrier distribution on performance enhancement of photomultiplication organic photodetectors" Elsevier (2019) 56-62.

Min Su Jang et al., "Spatial Confinement of the Optical Sensitizer to Realize a Thin Film Organic Photodetector with High Detectivity and Thermal Stability" Physical Chemistry Letters (2018) 9, 8-12.

Extended European Search Report dated Oct. 15, 2021 for corresponding European Application No. 211709571.

* cited by examiner

SENSORS AND ELECTRONIC DEVICES

CROSS-REFERENCE TO RELATED APPLICATIONS

This application is a continuation application of U.S. application Ser. No. 17/306,271, filed May 3, 2021, which claims priority to and the benefit of Korean Patent Application No. 10-2020-0056122 filed in the Korean Intellectual Property Office on May 11, 2020, the entire contents of each of which are incorporated herein by reference.

BACKGROUND

1. Field

Sensors and electronic devices are disclosed.

2. Description of the Related Art

An imaging device generates an image and may store the same as an electrical signal. The imaging device includes an image sensor that dissembles incident light into separate components according to incident light wavelength and converts each component to an electrical signal.

SUMMARY

Some example embodiments provide one or more sensors capable of improving efficiency and sensitivity.

Some example embodiments provide one or more electronic devices including the one or more sensors.

According to some example embodiments, a sensor may include a first electrode and a second electrode, and a photo-active layer between the first electrode and the second electrode, the photo-active layer including a light absorbing semiconductor configured to form a Schottky junction with the first electrode. The photo-active layer may have a charge carrier trapping site configured to capture photo-generated charge carriers generated based on the light absorbing semiconductor absorbing incident light that enters at least the photo-active layer at a position adjacent to the first electrode. The sensor may be configured to have an external quantum efficiency (EQE) that is adjustable based on a voltage bias applied between the first electrode and the second electrode.

As the voltage bias between the first electrode and the second electrode becomes larger, the external quantum efficiency (EQE) of the sensor may become higher, such that a magnitude of the external quantum efficiency (EQE) of the sensor may be proportional to a magnitude of the voltage bias between the first electrode and the second electrode.

An electric field applied between the first electrode and the second electrode may be greater than about 0 MV/cm and less than or equal to about 0.5 MV/cm.

The external quantum efficiency (EQE) of the sensor may exceed about 100%.

The light absorbing semiconductor may include one of a p-type non-polymeric semiconductor or an n-type non-polymeric semiconductor.

The photo-active layer may at least partially define a mono-continuous phase including one of the p-type non-polymeric semiconductor or the n-type non-polymeric semiconductor.

The p-type non-polymeric semiconductor may be a p-type monomer having a molecular weight of less than or equal to about 5000 Daltons and greater than 0 Daltons, and the n-type non-polymeric semiconductor may be an n-type monomer having a molecular weight of less than or equal to about 5000 Daltons and greater than 0 Daltons.

The p-type monomer may be an organic semiconductor including an electron donating moiety, a π-conjugated moiety, and an electron accepting moiety.

The light absorbing semiconductor may be configured to absorb light in at least one of a blue wavelength spectrum, a green wavelength spectrum, a red wavelength spectrum, or an infrared wavelength spectrum.

The light absorbing semiconductor may be included in about 90% to about 100% based on a total volume of the photo-active layer, such that about 90% to about 100% of the total volume of the photo-active layer is the light absorbing semiconductor.

A thickness of the photo-active layer may be equal to or greater than about 100 nm and less than or equal to about 3 μm.

The photo-active layer may have a first surface that is proximate to the first electrode, and a second surface facing the first surface and proximate to the second electrode such that the first surface and the second surface are opposite surfaces of the photo-active layer, wherein a surface roughness of the first surface of the photo-active layer may be between about 0 nm and about 10 nm.

The charge carrier trapping site in the photo-active layer in a direction extending perpendicular to the first surface of the photo-active layer may be within about 50% of a total thickness of the photo-active layer from the first surface of the photo-active layer.

The photo-generated charge carriers may be configured to serve as a switching to induce interfacial band bending of the Schottky junction, charge carriers may be transferred from the first electrode to the second electrode by the voltage bias, and a quantity of charge carriers transferred from the first electrode to the second electrode may be greater than a quantity of the photo-generated charge carriers that are generated based on the light absorbing semiconductor absorbing the incident light that enters at least the photo-active layer at the position adjacent to the first electrode.

The sensor may further include a buffer layer between the photo-active layer and the second electrode.

The sensor may further include a semiconductor substrate, and the semiconductor substrate may include a charge storage electrically connected to the second electrode.

The sensor may further include a color filter layer on the semiconductor substrate and at least partially overlapping the photo-active layer in a direction extending perpendicular to an upper surface of the semiconductor substrate.

The semiconductor substrate may further include a photodiode.

The light absorbing semiconductor may be configured to absorb light in a first wavelength spectrum that is one of a blue wavelength spectrum, a green wavelength spectrum, or a red wavelength spectrum, the photodiode may include a first photodiode configured to sense light in a second wavelength spectrum that is another one of the blue wavelength spectrum, the green wavelength spectrum, or the red wavelength spectrum, and the first wavelength spectrum and the second wavelength spectrum may be different from each other.

The photodiode may further include a second photodiode, the second photodiode being stacked with the first photodiode in the semiconductor substrate in a direction extending perpendicular or parallel to an upper surface of the semiconductor substrate, the second photodiode may be configured to sense light in a third wavelength spectrum that is a further one of the blue wavelength spectrum, the green wavelength spectrum, or the red wavelength spectrum, and the third wavelength spectrum may be different from both the first wavelength spectrum and the second wavelength spectrum, respectively.

According to some example embodiments, a method of operating a sensor, the sensor including a first electrode, a second electrode, and a photo-active layer between the first and second electrode, the photo-active layer including a light absorbing semiconductor, includes generating photo-generated charge carriers at the photo-active layer based on the photo-active layer absorbing incident light, capturing the photo-generated charge carriers at a charge carrier trapping site in the photo-active layer, causing the captured photo-generated charge carriers to induce interfacial band bending of a Schottky junction between the first electrode and the photo-active layer, applying a voltage bias between the first electrode and the second electrode cause the sensor to transfer charge carriers from the first electrode to the second electrode via the photo-active layer, and generating an electrical signal that is output from the sensor based on the charge carriers that are transferred to the second electrode.

The photo-generated charge carriers may serve as a switch to induce the interfacial band bending of the Schottky junction, and a quantity of the charge carriers transferred to the second electrode is greater than a quantity of the photo-generated charge carriers generated based on the photo-active layer absorbing the incident light.

The electrical signal transmitted to the second electrode may not include a separate electrical signal by the photo-generated charge carriers.

The voltage bias applied between the first electrode and the second electrode may be greater than about 0 MV/cm and less than or equal to about 0.5 MV/cm.

An external quantum efficiency (EQE) of the sensor may exceed about 100%.

According to some example embodiments, a camera including the sensor is provided.

According to some example embodiments, an electronic device including the sensor or the camera is provided.

According to some example embodiments, a sensor may include a first electrode and a second electrode, and a photo-active layer between the first electrode and the second electrode, the photo-active layer including a light absorbing semiconductor configured to form a Schottky junction with at least one of the first electrode or the second electrode. The photo-active layer may have a charge carrier trapping site configured to capture photo-generated charge carriers generated based on the light absorbing semiconductor absorbing incident light that enters at least the photo-active layer. The sensor may be configured to have an external quantum efficiency (EQE) that is adjustable based on a voltage bias applied between the first electrode and the second electrode.

The charge carrier trapping site may be configured to capture the photo-generated charge carriers generated based on the light absorbing semiconductor absorbing incident light that enters at least the photo-active layer at a position closer to the first electrode than to the second electrode.

The external quantum efficiency (EQE) of the sensor may exceed about 100%.

The light absorbing semiconductor may include one of a p-type non-polymeric semiconductor or an n-type non-polymeric semiconductor.

The photo-active layer may have a first surface that is proximate to the first electrode, and a second surface that is proximate to the second electrode, the second surface facing the first surface such that the first surface and the second surface are opposite surfaces of the photo-active layer. A surface roughness of the first surface of the photo-active layer may be between about 0 nm and about 10 nm.

The charge carrier trapping site in the photo-active layer in a direction extending perpendicular to the first surface of the photo-active may be within about 50% of a total thickness of the photo-active layer from the first surface of the photo-active layer.

The photo-generated charge carriers may be configured to serve as a switching to induce interfacial band bending of the Schottky junction, charge carriers may be transferred from the first electrode to the second electrode by the voltage bias, and a quantity of charge carriers transferred from the first electrode to the second electrode may be greater than a quantity of the photo-generated charge carriers that are generated based on the light absorbing semiconductor absorbing the incident light that enters at least the photo-active layer at a position adjacent to the first electrode.

The sensor may further include a buffer layer between the photo-active layer and the second electrode.

An electronic device may include the sensor.

The efficiency and sensitivity of the sensor may be improved.

DETAILED DESCRIPTION

Figure 1:
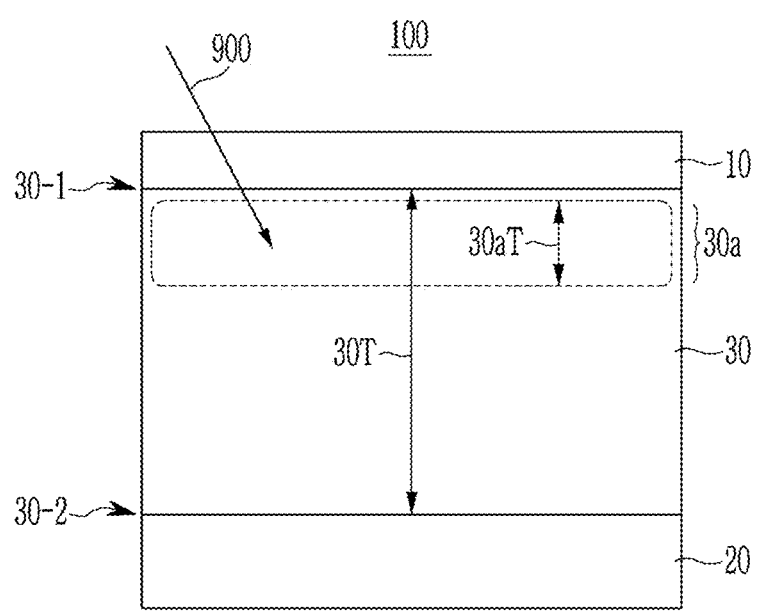
FIG. 1 is a cross-sectional view schematically showing an example of a device according to some example embodiments.

Hereinafter, some example embodiments will be described in detail so that those skilled in the art can easily implement them. However, the actual applied structure may be implemented in various different forms and is not limited to the implementations described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present such that the element and the other element are isolated from direct contact with each other by one or more interposing spaces and/or structures. In contrast, when an element is referred to as being "directly on" another element, there are no intervening elements present such that the element and the other element are in direct contact with each other. As described herein, an element that is "on" another element may be above, beneath, and/or horizontally adjacent to the other element.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

In the drawings, parts having no relationship with the description are omitted for clarity of the embodiments, and the same or similar constituent elements are indicated by the same reference numeral throughout the specification.

Hereinafter, the terms 'lower' and 'upper' are for convenience of description and do not limit the positional relationship. Hereinafter, the terms 'metal' includes a metal and a semimetal.

Hereinafter, the upper portion of the sensor will be described as a light-receiving surface, but this is for convenience of description and does not limit the positional relationship.

As used herein, when specific definition is not otherwise provided, the "substituted" refers to replacement of a hydrogen of a compound or a group by a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof.

As used herein, when specific definition is not otherwise provided, the term "'hetero" refers to one including 1 to 4 heteroatoms selected from N, O, S, Se, Te, Si, and P.

Hereinafter, "combination" refers to a mixture of two or more and a stack structure of two or more.

Hereinafter, when a definition is not otherwise provided, the energy level is the highest occupied molecular orbital (HOMO) energy level and/or the lowest unoccupied molecular orbital (LUMO) energy level.

Hereinafter, when a definition is not otherwise provided, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level.

Hereinafter, devices according to some example embodiments are described.

The device according to some example embodiments may include, for example, a pair of electrodes and a photo-active layer between the pair of electrodes, and the photo-active layer may include, for example, an opto-electronic material. The opto-electronic material may include, for example, a material configured to absorb light and exhibit electrical properties, but is not limited thereto. The device according to some example embodiments may be, for example, a photoelectric conversion device, a photo sensor, or a photo detector, but is not limited thereto.

The device according to some example embodiments may be, for example, an organic device including at least one organic material, and may be, for example, an organic diode including at least one organic material as an opto-electronic material.

The device according to some example embodiments may be, for example, a Schottky diode configured to form a Schottky junction under bias.

Figure 2:
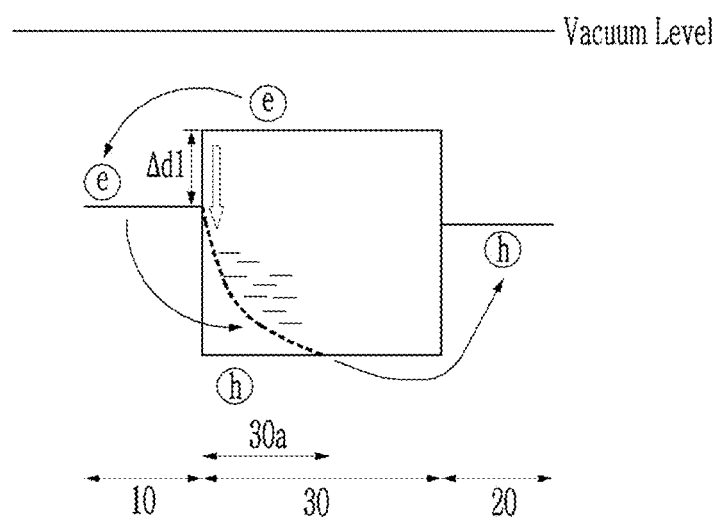
FIG. 2 is an energy diagram according to an example of the device of FIG. 1 according to some example embodiments.

FIG. 1 is a cross-sectional view schematically showing an example of a device according to some example embodiments and FIG. 2 is an energy diagram according to an example of the device of FIG. 1 according to some example embodiments. A device as described herein according to any example embodiments may be a sensor, and a sensor as described herein may be interchangeably referred to as a device.

Referring to FIG. 1, a sensor 100 according to some example embodiments includes a first electrode 10 and a second electrode 20, and a photo-active layer 30 between the first electrode 10 and the second electrode 20. In some example embodiments, the sensor 100 may be a sensor, including an image sensor, light sensor, or the like.

One of the first electrode 10 or the second electrode 20 may be an anode, and the other may be a cathode. For example, the first electrode 10 may be an anode and the second electrode 20 may be a cathode. For example, the first electrode 10 may be a cathode and the second electrode 20 may be an anode.

At least one of the first electrode 10 or the second electrode 20 may be a transparent electrode. The transparent electrode may have a high transmittance of greater than or equal to about 80%, for example greater than or equal to about 85%, greater than or equal to about 88%, or greater than or equal to about 90%. The transmittance may be equal to or less than about 100%, for example equal to or less than about 99%. The transparent electrode may include, for example, at least one of an oxide conductor, a carbon conductor, or a metal thin film. The oxide conductor may include, for example, at least one selected from indium tin oxide (ITO), indium zinc oxide (IZO), zinc tin oxide (ZTO), aluminum tin oxide (ATO) and aluminum zinc oxide (AZO), the carbon conductor may be at least one selected from graphene and carbon nanostructures, and the metal thin film may be an ultrathin film including aluminum (Al), magnesium (Mg), silver (Ag), gold (Au), an alloy thereof, or a combination thereof. The light-receiving electrode may be a transparent electrode.

One of the first electrode 10 or the second electrode 20 may be a reflective electrode. The reflective electrode may have, for example, a light transmittance of less than about 10% or a high reflectance of greater than or equal to about 5%. The reflective electrode may include a reflective conductor such as a metal, for example, aluminum (Al), silver (Ag), gold (Au), or an alloy thereof.

For example, the first electrode 10 and the second electrode 20 may be transparent electrodes, respectively. One of the first electrode 10 or the second electrode 20 may be a light-receiving electrode.

For example, the first electrode 10 may be a transparent electrode and the second electrode 20 may be a reflective electrode. The first electrode 10 may be a light-receiving electrode.

For example, the first electrode 10 may be a reflective electrode and the second electrode 20 may be a transparent electrode. The second electrode 20 may be a light-receiving electrode.

The photo-active layer 30 may be between the first electrode 10 and the second electrode 20.

The photo-active layer 30 may be configured to absorb light to generate photo-generated charge carriers. The light may be, for example, at least portion of light in a blue wavelength spectrum (hereinafter referred to as "blue light"), light in a green wavelength spectrum (hereinafter referred to as "green light"), light in a red wavelength spectrum (hereinafter referred to as "red light"), and/or light in an infrared wavelength spectrum (hereinafter referred to as "infrared light").

For example, the photo-active layer 30 may be configured to selectively absorb one of blue light, green light, red light, or infrared light. Herein, the selective absorption of one of blue light, green light, red light, or infrared light means that a peak absorption wavelength ($\lambda_{max}$) of an absorption spectrum is present in one of wavelength spectra of greater than or equal to about 380 nm and less than about 500 nm (blue light), about 500 nm to about 600 nm (green light), greater than about 600 nm and less than or equal to about 700 nm (red light) or greater than about 700 nm to less than about 3000 nm (infrared light), and that the absorption spectrum (e.g., fraction of incident radiation absorbed by the photo-active layer 30) in the corresponding wavelength spectrum is significantly higher than that of other wavelength spectra. Herein, the "significantly higher" may mean being about 70% or more, about 75% or more, about 80% or more, about 85% or more, about 90% or more, or about 95% or more based on the total absorption spectrum.

For example, the photo-active layer 30 may be configured to absorb at least two of blue light, green light, red light, or infrared light, for example, absorb blue light, green light, and red light.

The photo-active layer 30 may include a light absorbing semiconductor having the aforementioned light absorbing characteristics. The light absorbing semiconductor may be and/or include one of a p-type semiconductor or an n-type semiconductor having the aforementioned absorption characteristics, and the p-type semiconductor or the n-type semiconductor may be configured to form a Schottky junction with the first electrode 10. Accordingly, it will be understood that the photo-active layer 30 may include a light absorbing semiconductor that is configured to form a Schottky junction with the first electrode 10. In some example embodiments, the light absorbing semiconductor may be configured to form a Schottky junction with the second electrode 20 instead of, or in addition to, a Schottky junction with the first electrode. Accordingly, it will be understood that the photo-active layer 30 may include a light absorbing semiconductor configured to form a Schottky junction with at least one of the first electrode 10 or the second electrode 20. Since the Schottky junction is formed between an electrode and the p-type semiconductor or an electrode and the n-type semiconductor, unlike the pn junction, the p-type semiconductor and the n-type semiconductor are not included together. The p-type semiconductor may include one or more types, and the n-type semiconductor may include one or more types.

The light absorbing semiconductor may be, for example, a p-type or n-type non-polymeric semiconductor having the aforementioned light absorbing characteristics, and the p-type or n-type non-polymeric semiconductor may be, for example, a p-type or n-type inorganic semiconductor, a p-type or n-type organic-inorganic semiconductor, a p-type or n-type non-polymeric organic semiconductor (low molecular weight semiconductor), or a combination thereof. For example, a p-type or n-type inorganic semiconductor, a p-type or n-type organic-inorganic semiconductor, or a p-type or n-type non-polymeric organic semiconductor (low molecular weight semiconductor) may include a wavelength-selective absorbing material configured to selectively absorb one of blue light, green light, red light, or infrared light. Accordingly, the light absorbing semiconductor may be configured to absorb light (e.g., at least some of incident light 900) in at least one of a blue wavelength spectrum, a green wavelength spectrum, a red wavelength spectrum, or an infrared wavelength spectrum The p-type or n-type non-polymeric semiconductor may form (e.g., define) a charge carrier trapping site 30a intentionally or unintentionally formed by conformations of the molecules themselves, such as arrangement, alignment, and/or stacking of the molecules. The charge carrier trapping site 30a will be described later.

For example, the light absorbing semiconductor may include a p-type inorganic semiconductor, a p-type organic-inorganic semiconductor, a p-type low molecular weight semiconductor, or a combination thereof. The p-type low molecular weight semiconductor may be, for example, a p-type monomer, for example, a p-type monomer having a molecular weight of less than or equal to about 5000, less than or equal to about 4000, or less than or equal to about 3000. The molecular weight of said p-type monomer may be equal to or greater than about 0, 0.01, 0.1, 1, or the like. Molecular weight magnitudes as described herein may be in units of Daltons, also referred to as unified atomic mass units (e.g., the p-type low molecular weight semiconductor may be a p-type monomer having a molecular weight of less than or equal to about 5000 Daltons and greater than 0 Daltons).

For example, the light absorbing semiconductor may include an n-type inorganic semiconductor, an n-type organic-inorganic semiconductor, an n-type low molecular weight semiconductor, or a combination thereof. The n-type low molecular weight semiconductor may be, for example, an n-type monomer, for example, an n-type monomer having a molecular weight of less than or equal to about 5000, less than or equal to about 4000, or less than or equal to about 3000. The molecular weight of said n-type monomer may be equal to or greater than about 0, 0.01, 0.1, 1, or the like. Molecular weight magnitudes as described herein may be in units of Daltons, also referred to as unified atomic mass units (e.g., the n-type low molecular weight semiconductor may be an n-type monomer having a molecular weight of less than or equal to about 5000 Daltons and greater than 0 Daltons).

For example, the p-type monomer may have a core structure including an electron-donating moiety, a π-conjugated linking group, and an electron-accepting moiety.

For example, the p-type low molecular weight semiconductor may be represented by Chemical Formula A, but is not limited thereto.

[Chemical Formula A]

EDM—LM—EAM

In Chemical Formula A,

LM is a 7-conjugated linking group, and may be a C2 to C30 heterocyclic group having at least one of O, S, Se, Te, or Si, EDM may be an electron donating moiety, and EAM may be an electron accepting moiety.

For example, the p-type monomer represented by Chemical Formula A may be configured to selectively absorb green light and may be, for example, represented by Chemical Formula A-1.

[Chemical Formula A-1]

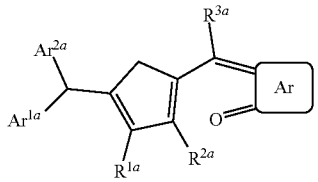

In Chemical Formula A-1,

X may be O, S, Se, Te, SO, $SO_2$, or $SiR^aR^b$,

Ar may be a substituted or unsubstituted C6 to C30 arylene group, a substituted or unsubstituted C3 to C30 heterocyclic group, or a fused ring of the foregoing two or more, $Ar^{1a}$ and $Ar^{2a}$ may independently be a substituted or unsubstituted C6 to C30 aryl group or a substituted or unsubstituted C3 to C30 heteroaryl group, $R^{1a}$ to $R^{3a}$, $R^a$, and $R^b$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, and $R^{1a}$ to $R^{3a}$ and $Ar^{1a}$ and $Ar^{2a}$ may independently be present or two adjacent groups thereof may be combined with each other to form a fused ring.

For example, in Chemical Formula A-1, $Ar^{1a}$ and $Ar^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, or a substituted or unsubstituted pyridopyridazinyl group.

For example, $Ar^{1a}$ and $Ar^{2a}$ of Chemical Formula A-1 may be linked to each other to form a ring or for example, $Ar^{1a}$ and $Ar^{2a}$ may be linked to each other by one of a single bond, —$(CR^gR^h)_{n2}$— (n2 is 1 or 2), —O—, —S—, —Se—, —N=, —$NR^i$—, —$SiR^jR^k$—, or —$GeR^lR^m$— to form a ring. Herein, $R^g$ to $R^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a combination thereof.

For example, $R^{1a}$ and $Ar^{1a}$ of Chemical Formula A-1 may be linked to each other to form a ring, and for example may be linked to each other to form a ring by one selected from a single bond, —$(CR^gR^h)_{n2}$— (n2 is 1 or 2), —O—, —S—, —Se—, —N=, —$NR^i$—, —$SiR^jR^k$—, and —$GeR^lR^m$—. Herein $R^g$ to $R^m$ are the same as described above.

For example, the p-type monomer represented by Chemical Formula A-1 may be represented by one of Chemical Formulas A-2 to A-7.

[Chemical Formula A-2]

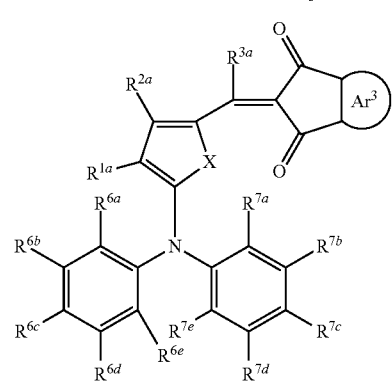

[Chemical Formula A-3]

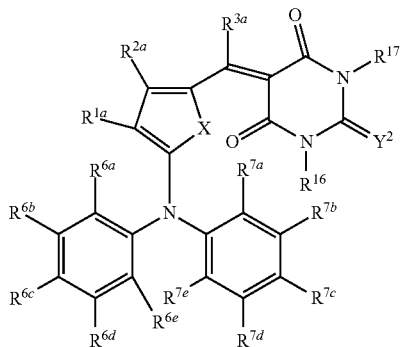

[Chemical Formula A-4]

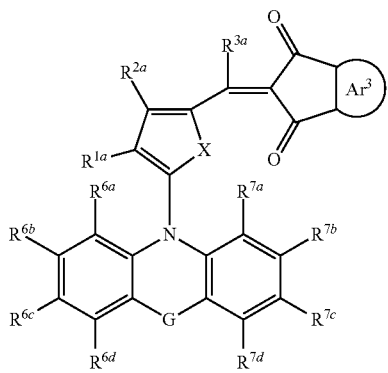

[Chemical Formula A-5]

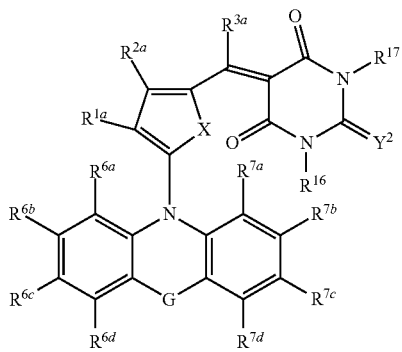

[Chemical Formula A-6]

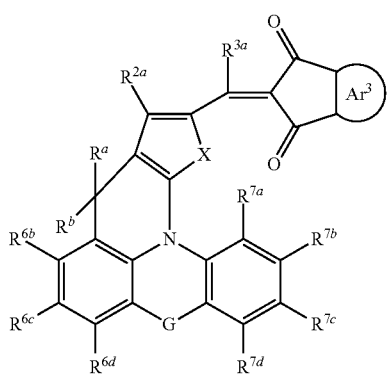

[Chemical Formula A-7]

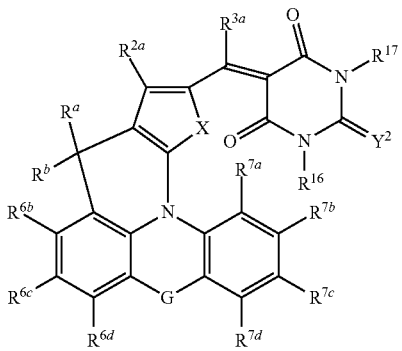

In Chemical Formulas A-2 to A-7,

X and $R^{1a}$ to $R^{3a}$ are the same as described above, $Ar^3$ may be a substituted or unsubstituted C6 to C30 arylene group, a substituted or unsubstituted C3 to C30 heterocyclic group, or a fused ring of the foregoing two or more, G may be one of a single bond, —$(CR^gR^h)_{n2}$— (n2 is 1 or 2), —O—, —S—, —Se—, —N=, —$NR^i$—, —$SiR^jR^k$—, or —$GeR^lR^m$—, wherein $R^g$ to $R^m$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, wherein $R^g$ and $R^h$, $R^j$ and $R^k$ and $R^l$ and $R^m$ may independently be present or may be linked to each other to form a ring, $Y^2$ may be O, S, Se, Te, or $C(R^q)(CN)$ (wherein $R^q$ is hydrogen, a cyano group (—CN), or a C1 to C10 alkyl group), $R^{6a}$ to $R^{6e}$, $R^{7a}$ to $R^{7e}$, $R^{16}$, $R^{17}$, $R^g$, and $R^h$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, and $R^{1a}$ to $R^{3a}$, $R^{6a}$ to $R^{6e}$, and $R^{7a}$ to $R^{7e}$ may independently be present or two adjacent groups thereof may be linked to each other to form a fused ring.

For example, $Ar^3$ of Chemical Formulas A-2, A-4, and/or A-6 may be benzene, naphthylene, anthracene, thiophene, selenophene, tellurophene, pyridine, pyrimidine, or two or more fused rings selected from foregoing rings.

The light absorbing semiconductor may occupy most of the photo-active layer 30, and for example, the light absorbing semiconductor may be included in an amount of about 90% to about 100%, about 92% to about 100%, about 95% to about 100%, about 97% to about 100%, about 98% to about 100%, or about 99% to about 100% based on a total volume of the photo-active layer 30. For example, about 90% to about 100% of the total volume of the photo-active layer 30 may be the light absorbing semiconductor.

For example, the photo-active layer 30 may be formed of (e.g., may partially or completely comprise) one of the aforementioned p-type non-polymeric semiconductor or n-type non-polymeric semiconductor, and may form (e.g., define) a mono-continuous phase composed of (e.g., at least partially or completely comprising) one of the p-type non-polymeric semiconductor or n-type non-polymeric semiconductor (which may be the same as or different from the one of the p-type non-polymeric semiconductor or n-type non-polymeric semiconductor at least partially or completely comprising the photo-active layer 30).

For example, the photo-active layer 30 may optionally further include an additive capable of improving absorption characteristics and/or electrical characteristics, in addition to the light absorbing semiconductor. The additives may be, for example an inorganic material, an organic material, and/or an organic-inorganic material. For example, the additive may be a non-light absorbing material or a light absorbing material. The additive may be included in a small amount in the photo-active layer 30, for example, in an amount of less than about 10%, less than or equal to about 9%, less than or equal to about 5%, less than or equal to about 3%, less than or equal to about 2%, less than or equal to about 1%, or less than or equal to about 0.5% based on a total volume of the photo-active layer 30.

The photo-active layer 30 may form a Schottky junction with the first electrode 10. For example, the photo-active layer 30 has a first surface 30-1 close to (e.g., proximate to, adjacent to, etc.) the first electrode 10 and a second surface 30-2 facing the first surface 30-1 and close to (e.g., proximate to, adjacent to) the second electrode 20, such that the first surface 30-1 and the second surface 30-2 may be opposite surfaces of the photo-active layer 30. In some example embodiments, the first surface 30-1 may be in direct contact with the first electrode 10 or may be isolated from direct contact with the first electrode 10. In some example embodiments, the second surface 30-2 may be in direct contact with the second electrode 20 or may be isolated from direct contact with the second electrode 20. The photo-active layer 30 may form a Schottky junction between the first electrode 10 and the first surface 30-1 of the photo-active layer 30 and/or between the second electrode 20 and the second surface 30-2 of the photo-active layer 30. The sensor 100 may be a Schottky diode.

The sensor 100 may have current-voltage (I-V) characteristics in which a current may flow at a particular (or, alternatively, predetermined) voltage or more and the current changes according to the voltage. For example, when a particular (or, alternatively, predetermined) voltage is applied between the first electrode 10 and the second electrode 20 (e.g., separate voltages are applied to the first and second electrodes 10 and 20, respectively to cause a voltage bias to be applied between the first and second electrodes 10 and 20), a current (e.g., electrical current) may flow through the photo-active layer 30, and an amount (e.g., magnitude) of current flowing through the photo-active layer 30 may linearly increase as the applied voltage (e.g., magnitude of the voltage bias) increases.

The photo-active layer 30 may have a charge carrier trap site 30a that may be adjacent to the first electrode 10, that is, close to the first surface 30-1 of the photo-active layer 30 (e.g., closer to the first surface than to the second surface 30-2). However, it will be understood that the charge carrier trap site 30a as described herein may be located at any position within the photo-active layer 30, such that the charge carrier trap site 30a may be closer to the second surface 30-2 than to the first surface 30-1 or equidistant between the first and second surfaces 30-1 and 30-2. The charge carrier trapping site 30a may have a plurality of trap states between the HOMO energy level and the LUMO energy level of the photo-active layer 30, and the plurality of trap states may be intentionally or unintentionally formed by the conformations of molecules such as arrangement, alignment, and/or stacking of p-type or n-type non-polymeric semiconductor molecules as described above. The plurality of trap states may be, for example, about $10^{11}$ to about $10^{15}$, and may be about $10^{12}$ to about $10^{14}$, but is not limited thereto.

When the photo-active layer 30 includes a polymeric semiconductor, in order to form a charge carrier trapping site having a plurality of trap states at the first surface 30-1 of the photo-active layer 30 in contact with the first electrode 10, a separate processing is required. However, the sensor 100 according to some example embodiments may include a p-type non-polymeric semiconductor or an n-type non-polymeric semiconductor in the photo-active layer 30 to form a charge carrier trapping site having a plurality of trap states without additional processing. For example, the photo-active layer 30 including a polymeric semiconductor requires an additional process of forming a high surface roughness of greater than or equal to about 10 nm (e.g., about 10 nm to about 1000 nm, etc.) in order to form a charge carrier trapping site on the surface. However, the photo-active layer 30 of the sensor 100 according to some example embodiments may have a charge carrier trapping site of sufficient thickness with a low surface roughness of less than about 10 nm (e.g., about 0 nm to about 10 nm, about 0.1 nm to about 10 nm, etc.) without additional treatment. The values of surface roughness for a surface as described herein (e.g., a surface roughness of less than about 10 nm) may refer to an average deviation of the surface from an average center line extending in parallel to the first electrode 10 and/or second electrode 20 (e.g., an surface roughness of less than about 10 nm).

For example, the position and thickness 30aT of the charge carrier trapping site 30a may vary depending on types of the light absorbing semiconductor. For example, most may be present within about 50% of a total thickness 30T of the photo-active layer 30 from the first surface 30-1 of the photo-active layer 30. Restated, a thickness 30aT of the charge carrier trapping site 30a in a direction extending perpendicular to the first surface 30-1 of the photo-active layer 30 may be about 50% or less of the total thickness 30T of the photo-active layer 30 from the first surface 30-1 of the photo-active layer 30 in said direction. It will be understood that a "thickness" as described herein may refer to a thickness in a direction that is perpendicular to one or both of the first surface 30-1 and/or the second surface 30-2.

Referring to FIG. 1, when light (e.g., incident light 900) enters the sensor 100 (e.g., enters the photo-active layer 30 via passing through one or both of the first electrode 10 and/or the second electrode 20), photo-generated charge carriers may be generated in the photo-active layer 30 based on light absorption of the aforementioned light absorbing semiconductor (e.g., based on the light absorbing semiconductor absorbing at least a portion of said incident light that enters at least the photo-active layer 30), and a plurality of trap states in the charge carrier trapping sites 30a may be configured to capture these photo-generated charge carriers. Restated, at least one charge carrier trapping site 30a of the photo-active layer 30 may be configured to capture photo-generated charge carriers that are generated based on the light absorbing semiconductor of the photo-active layer 30 absorbing at least a portion of incident light 900 that enters at least the photo-active layer 30 at a position within the photo-active layer 30, which may be a position adjacent to the first electrode 10, adjacent to the second electrode 20, equidistant between the first and second electrodes 10 and 20, or the like.

In some example embodiments, the photo-active layer 30 may include multiple charge carrier trapping sites 30a. At least one of the charge carrier trapping sites 30a may be adjacent (e.g., directly adjacent or proximate and indirectly adjacent) to the first electrode 10. Another at least one of the charge carrier trapping sites 30a may be adjacent (e.g., directly adjacent or proximate and indirectly adjacent) to the second electrode 20. The charge carrier trapping sites may be stacked in the direction extending between the first and second electrodes 10 and 20 through the photo-active layer 30.

The at least one charge carrier trapping site 30a may be located at a position that is directly adjacent to the first surface 30-1, closer to the first surface 30-1 than to the second surface 30-2, at a position that is a particular distance from the first surface 30-1 that is equal to or less than about 10% of the magnitude of the distance between the first and second electrodes 10 and 20 (the charge carrier trapping site 30a may be located at a position that is located at a distance from the first surface 30-1 that is between 0% and about 10% of the distance between the first and second surfaces 30-1 and 30-2). In some example embodiments, the at least one charge carrier trapping site 30a may include a portion of the photo-active layer 30 that is at least partially defined by the first surface 30-1, such that the at least one charge carrier trapping site 30a may be understood to be in direct contact with the first surface 30-1. The captured photo-generated charge carriers may be configured to induce interfacial band bending of the Schottky junction between the first electrode 10 and the photo-active layer 30 (e.g., the sensor 100 may be configured to cause the captured photo-generated charge carriers to induce interfacial band bending of the Schottky junction between the first electrode 10 and the photo-active layer 30), thereby energy barrier (Δd1) between the first electrode 10 and the photo-active layer 30 may be lowered or removed, and charge carriers may be effectively injected from the first electrode 10 to the photo-active layer 30 by an external voltage applied between the first electrode 10 and the second electrode 20, such as a reverse bias.

That is, the photo-generated charge carriers generated in the photo-active layer 30 by light may be configured to serve as a switching that induces an interfacial band bending of the Schottky junction, charge carriers are effectively injected from the first electrode 10 to the photo-active layer 30 by application of an external voltage, and the charge carriers injected into the photo-active layer 30 may be transferred to the second electrode 20 and may be read as an electrical signal of the sensor 100 (e.g., charge carriers may be transferred from the first electrode 10 to the second electrode 20 via the photo-active layer 30 by the applied external voltage that is a bias, and the transferred charge carriers that arrive at the second electrode may be read as an electrical signal of the sensor 100). Herein, according to a strength of the applied voltage, an amount of electric charge (amount of current) transferred from the first electrode 10 to the second electrode 20 may be adjusted, and as the strength of the applied voltage becomes larger, the amount of current may become higher. For example, the electric field applied between the first electrode 10 and the second electrode 20 may be greater than about 0 MV/cm and less than or equal to about 0.5 MV/cm (e.g., between about 0.001 MV/cm and about 0.5 MV/cm, between about 0.01 MV/cm and about 0.5 MV/cm, etc.), but is not limited thereto.

As described above, in the sensor 100 according to some example embodiments, the photo-generated charge carriers by light may serve as a switching function for inducing interfacial band bending and the amount of charge transferred from the first electrode 10 to the second electrode 20 may be adjusted by the intensity of the external bias. It will be understood that an external bias or bias as described herein may be interchangeably referred to as a voltage bias applied between the first and second electrodes 10 and 20, for example based on one or more voltages being applied to one or more of the first and second electrodes 10 and 20 to cause an applied voltage or voltage difference between the first and second electrodes 10 and 20. As the external bias becomes larger, that is, the applied voltage between the first electrode 10 and the second electrode 20 becomes higher, the amount of current flowing through the photo-active layer 30 may linearly increase. Restated, the sensor 100 may be configured to have an adjustable external quantum efficiency (EQE) having a magnitude that is proportional (e.g., directly proportional) to a magnitude of the bias (e.g., applied voltage difference) between the first electrode and the second electrode. Accordingly, unlike the pn junction device, in which the amount of current is determined according to the amount of absorbed light, the sensor 100 according to some example embodiments may obtain a sufficient amount of current by adjusting the external bias even in a weak light (low luminance) environment, thereby implementing a highly efficient device.

For example, in the case of a pn junction device, the photo-generated charge carriers generated by light are transferred to the first electrode 10 and/or the second electrode 20 and is read as a current value of the pn junction device, so that external quantum efficiency (EQE) may not exceed 100%. However, in the case of the sensor 100 according to some example embodiments, regardless of the amount of photo-generated charge carriers generated by light, a desired current value may be obtained according to an intensity of the external bias, so that an external quantum efficiency of more than 100% may be obtained. Restated, the external quantum efficiency (EQE) of the sensor 100 may exceed about 100%. That is, charge carriers transferred from the first electrode 10 to the second electrode 20 according to an external bias may be more than photo-generated charge carriers. For example, a quantity of charge carriers transferred from the first electrode to the second electrode by the bias (e.g., applied external bias, applied voltage difference between the first and second electrodes 10 and 20, etc.) may be greater than a quantity of the photo-generated charge carriers that are generated based on the light absorbing semiconductor of the photo-active layer 30 absorbing the incident light 900 that enters at least the photo-active layer 30 at the position adjacent to the first electrode 10. For example, as the bias between the first electrode 10 and the second electrode 20 (e.g., a difference between voltages applied respectively to the first and second electrodes 10 and 20) increases, the external quantum efficiency (EQE) of the sensor 100 may increase, and the external quantum efficiency (EQE) of the sensor 100 may be greater than about 100%, greater than about 1000%, or greater than about 10000%. Accordingly, it will be understood that the sensor 100 may be configured to be associated with (e.g., to have) an external quantum efficiency (EQE) that is adjustable based on a bias (e.g., external bias, voltage bias, etc.) being applied between the first and second electrodes 10 and 20 (e.g., the magnitude of the external quantum efficiency (EQE) may be adjustable based on the magnitude of the applied bias). For example, the sensor 100 may be configured to adjust the EQE of the sensor 100 based on and/or in response to a difference between a first voltage applied to the first electrode and a second voltage applied to the second electrode 20.

In some example embodiments, since the sensor 100 according to some example embodiments does not generate photo-generated charge carriers in a light-free (dark) environment, the interfacial band bending of the Schottky junction described above does not occur, and accordingly, the aforementioned mechanism does not operate to suppress generation of a dark current.

A total thickness 30T of the photo-active layer 30 may be equal to or greater than about 100 nm and less than or equal to about 3 μm (e.g., may be about 100 nm to about 3 μm), and within the above range, may be about 200 nm to about 3 μm, about 300 nm to about 3 μm, or about 500 nm to about 3 μm.

The sensor 100 may further include an anti-reflection layer (not shown) on the first electrode 10 or under the second electrode 20. The anti-reflection layer may be on the side where the light is incident, and the light absorption may be further improved by lowering the reflectivity of the incident light. For example, when light is incident through the first electrode 10, the anti-reflection layer may be disposed on the first electrode 10, while when light is incident through the second electrode 20, the anti-reflection layer may be disposed under the second electrode 20.

The anti-reflection layer may include, for example a material having a refractive index of about 1.6 to about 2.5, and may include for example at least one of a metal oxide, a metal sulfide, or an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

The aforementioned sensor 100 may be operated by supplying light to the photo-active layer 30 and applying a bias between the first electrode 10 and the second electrode 20. Specifically, the aforementioned sensor 100 may be operated by absorbing light in the photo-active layer 30 to generate photo-generated charge carriers, capturing the photo-generated charge carriers in trap states in a charge carrier trapping site in the photo-active layer 30, inducing the interfacial band bending of the Schottky junction between the first electrode 10 and the photo-active layer 30 by the captured photo-generated charge carriers, applying a bias between the first electrode 10 and the second electrode 20 and transferring charge carriers from the first electrode 10 to the second electrode 20 through the photo-active layer 30 by a (reverse) bias, and reading an electrical signal transmitted to the second electrode 20.

Unlike the pn junction device, the sensor 100 according to some example embodiments serves as a switching function in which photo-generated charge carriers induce the interfacial band bending of the Schottky junction, so that the electrical signal transmitted to the second electrode 20 may be determined according to an intensity of an external bias, and the electrical signal caused by the photo-generated charge carriers may not be read.

As described above, since the sensor 100 according to some example embodiments is switched by the photo-generated charge carriers and a current value may be adjusted for an intensity of the external bias, a sufficient amount of current may be obtained by adjusting the external bias even in a weak light (low luminance) environment. Accordingly, it is possible to implement a high-efficiency device even in a low-light (low luminance) environment.

Hereinafter, another example of a device according to some example embodiments is described.

Figure 3:
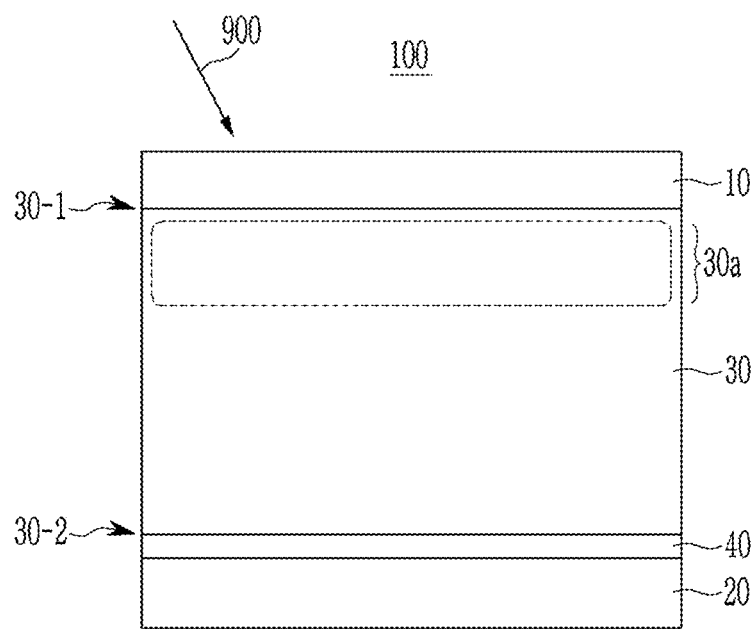
FIG. 3 is a cross-sectional view showing another example of a device according to some example embodiments.

FIG. 3 is a cross-sectional view showing another example of a device according to some example embodiments.

Referring to FIG. 3, the sensor 100 according to some example embodiments includes a first electrode 10, a second electrode 20, and a photo-active layer 30 as in some example embodiments, including the example embodiments shown in at least FIG. 1.

However, the sensor 100 according to some example embodiments, including the example embodiments shown in at least FIG. 3, unlike some example embodiments, including the example embodiments shown in at least FIG. 1, further includes a buffer layer 40 between (e.g., directly or indirectly between) the second electrode 20 and the photo-active layer 30. The buffer layer 40 may increase charge carriers mobility from the photo-active layer 30 to the second electrode 20 while blocking the reverse movement of charge carriers from the second electrode 20 to the photo-active layer 30.

The buffer layer 40 may include, for example, an organic material, an inorganic material, and/or an organic-inorganic material.

The buffer layer 40 may include, for example, a compound represented by Chemical Formula B-1 or B-2.

[Chemical Formula B-1]

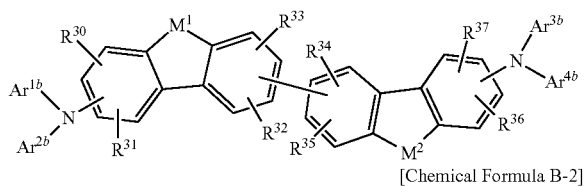

[Chemical Formula B-2]

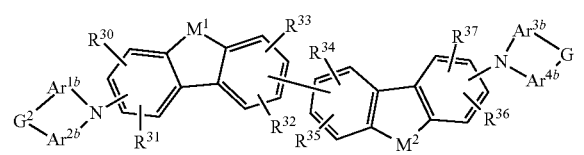

In Chemical Formula B-1 or B-2, $M^1$ and $M^2$ may independently be $CR^nR^o$, $SiR^pR^q$, $NR^r$, O, S, Se, or Te, $Ar^{1b}$, $Ar^{2b}$, $Ar^{3b}$, and $Ar^{4b}$ in Chemical Formula B-1 may independently be a substituted or unsubstituted C6 to C30 aryl group or a substituted or unsubstituted C3 to C30 heteroaryl group, and $A^{1b}$, $Ar^{2b}$, $Ar^{3b}$, and $Ar^{4b}$ in Chemical Formula B-2 may independently be a substituted or unsubstituted C6 to C30 arylene group or a substituted or unsubstituted C3 to C30 heteroarylene group.

$G^2$ and $G^3$ may independently be a single bond, $-(CR^sR^t)_{n3}-$, $-O-$, $-S-$, $-Se-$, $-N=$, $-NR^u-$, $-SiR^vR^w-$ or $-GeR^xR^y-$, wherein n3 is 1 or 2, and $R^{30}$ to $R^{37}$ and Rn to RY may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

The compound represented by Chemical Formula B-1 or B-2 may be, for example, a compound represented by Chemical Formula B-3 or B-4.

[Chemical Formula B-3]

[Chemical Formula B-4]

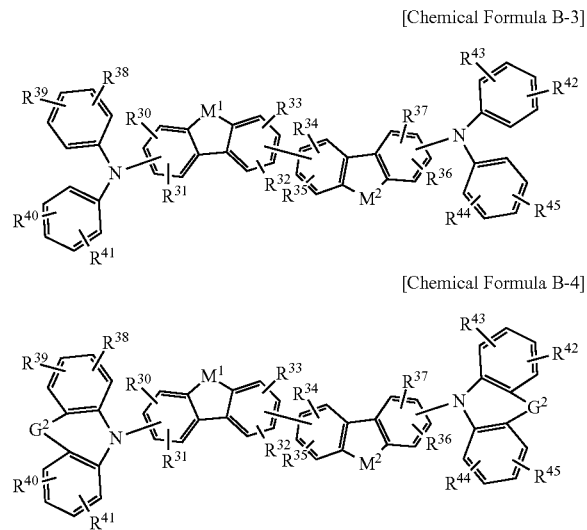

In Chemical Formula B-3 or B-4, $M^1$, $M^2$, $G^2$, $G^3$, $R^{30}$ to $R^{37}$ are the same as described above, and $R^{38}$ to $R^{45}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

The compound represented by Chemical Formula B-3 or B-4 may be, for example, a compound represented by Chemical Formula B-5 or B-6.

In Chemical Formula B-5 or B-6, $R^{38}$ to $R^{45}$ and $R^o$ and $R^n$ are the same as described above.

The aforementioned sensor 100 may be applied to, for example, a sensor, and the sensor may be, for example, an image sensor. As described above, the image sensor to which the aforementioned sensor 100 is applied may be configured to adjust electrical characteristics such as external quantum efficiency (EQE) based on external bias (e.g., bias applied between the first and second electrodes 10 and 20) even in a weak light (low luminance) environment, so that it may be effectively applied to an image sensor used in a low luminance environment and/or an image sensor requiring high efficiency.

Hereinafter, some example embodiments of the image sensor to which the aforementioned device is applied are described with reference to the drawings. Herein, an organic CMOS image sensor is described as an example of the image sensor.

Figure 4:
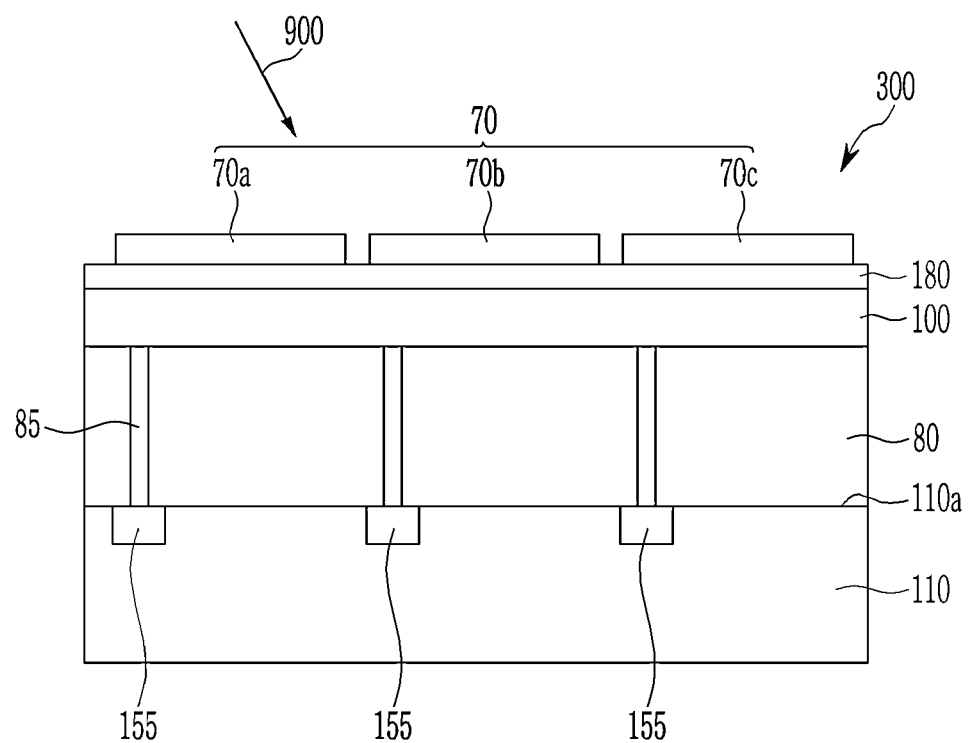
FIG. 4 is a cross-sectional view showing an example of an image sensor according to some example embodiments.

FIG. 4 is a cross-sectional view showing an example of an image sensor according to some example embodiments.

Referring to FIG. 4, an image sensor 300 according to some example embodiments includes a semiconductor substrate 110, an insulating layer 80, a sensor 100, and a color filter layer 70.

The semiconductor substrate 110 may be a silicon substrate, and a transmission transistor (not shown) and a charge storage 155 are integrated therein. The transmission transistor and/or the charge storage 155 may be integrated for each pixel. The charge storage 155 is electrically connected to the sensor 100 (e.g., the charge storage 155 may be included in the semiconductor substrate 110 and may be electrically connected to a second electrode 20 of the sensor 100, for example based on charge storage 155 being in direct contact with the trench 85 that is itself in direct contact with the second electrode 20 of the sensor 100).

Metal wires (not shown) and pads (not shown) are formed on the semiconductor substrate 110. In order to decrease

[Chemical Formula B-5]

[Chemical Formula B-6]

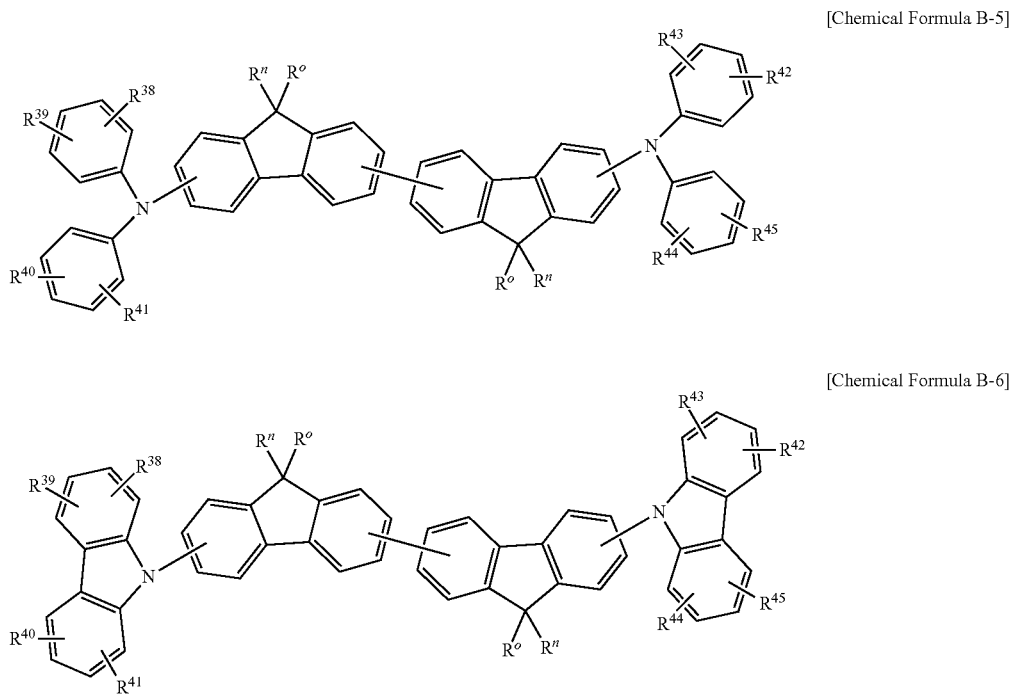

signal delay, the metal wires and pads may be made of a metal having low resistivity, for example, aluminum (Al), copper (Cu), silver (Ag), and/or alloys thereof, but are not limited thereto.

An insulating layer 80 is formed on the metal wires and the pads. The insulating layer 80 may be made of an inorganic insulating material such as a silicon oxide and/or a silicon nitride, or a low dielectric constant (low K) material such as SiC, SiCOH, SiCO, and SiOF. The insulating layer 80 has a trench 85 exposing the charge storage 155. The trench 85 may be filled with a filler.

The aforementioned sensor 100 is formed on the insulating layer 80. The sensor 100 may have a structure shown in FIG. 1 or 3, and detailed description is the same as described above. One of the first electrode 10 or the second electrode 20 of the sensor 100 may be a light-receiving electrode, and the other of the first electrode 10 and the second electrode 20 of the sensor 100 may be connected (e.g., electrically connected) to the charge storage 155. For example, the first electrode 10 of the sensor 100 may be a light-receiving electrode and the second electrode 20 of the sensor 100 may be connected to the charge storage 155. For example, the second electrode 20 of the sensor 100 may be a light-receiving electrode, and the first electrode 10 of the sensor 100 may be connected to the charge storage 155 via a conductive material (e.g., a metal having low resistivity, for example, aluminum (Al), copper (Cu), silver (Ag), and/or alloys thereof) located within the trench 85.

A color filter layer 70 is formed on the sensor 100 and thus on the semiconductor substrate 110. As shown in at least FIG. 4 (and as further shown in at least FIGS. 6 and 13), the color filter layer 70 may be overlapped, at least partially or completely, with the photo-active layer 30 of the sensor 100 in a direction extending perpendicular to the upper surface 110a of the semiconductor substrate 110. The color filter layer 70 may include a blue filter 70a formed in a blue pixel, a red filter 70b formed in a red pixel, and a green filter 70c formed in a green pixel. However, the present inventive concepts are not limited thereto, and a cyan filter, a magenta filter, and/or a yellow filter may be included instead or additionally.

An insulating layer 180 is formed between the sensor 100 and the color filter layer 70. The insulating layer 180 may be omitted.

A focusing lens (not shown) may be further formed on the color filter layer 70. The focusing lens may control direction of incident light and gather the light in one region. The focusing lens may have a shape of, for example, a cylinder or a hemisphere, but is not limited thereto.

Figure 5:
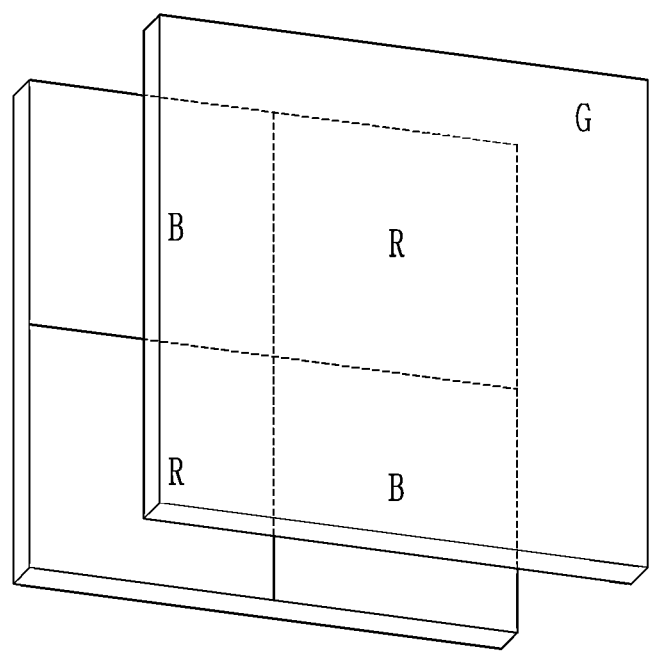
FIG. 5 is a top plan view of an example of an image sensor according to some example embodiments.
Figure 6:
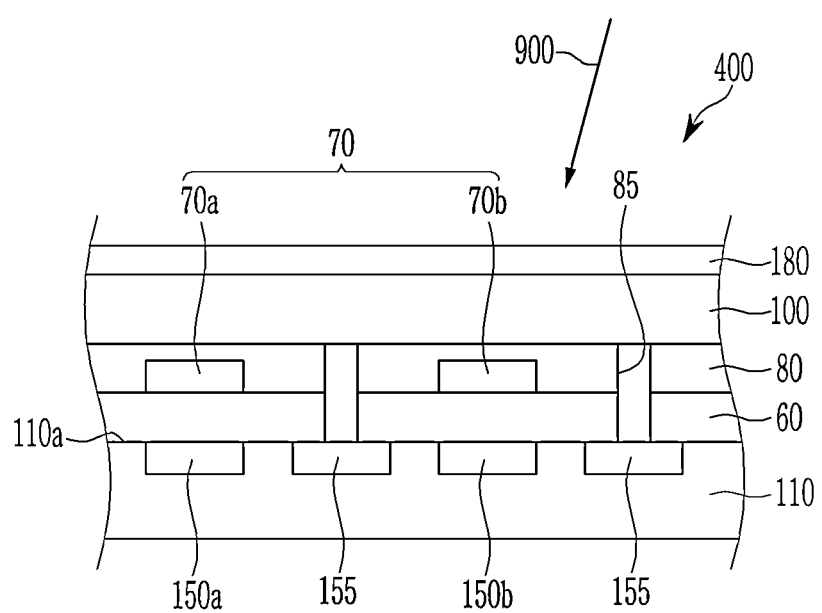
FIG. 6 is a cross-sectional view showing an example of the image sensor of FIG. 5.

FIG. 5 is a top plan view of an example of an image sensor according to some example embodiments and FIG. 6 is a cross-sectional view showing an example of the image sensor of FIG. 5 according to some example embodiments.

Referring to FIGS. 5 and 6, an image sensor 400 according to some example embodiments includes a semiconductor substrate 110 in which photo-sensing devices 150a, and 150b, a transmission transistor (not shown), and a charge storage 155 are integrated; a lower insulating layer 60; a color filter layer 70; an upper insulating layer 80; and the aforementioned sensor 100.

The semiconductor substrate 110 may be a silicon substrate, and the photo-sensing devices 150a and 150b, the transmission transistor (not shown), and the charge storage 155 are integrated therein. The photo-sensing devices 150a and 150b may be photodiodes and may be understood to be stacked in the semiconductor substrate 110 in a direction extending parallel to the upper surface 110a of the semiconductor substrate 110. It will be understood that the semiconductor substrate 110 according to some example embodiments, including the example embodiments shown in at least FIGS. 6, 7, and 13, may include at least one photodiode (e.g., at least one of the photo-sensing devices 150a and/or 150b).

The photo-sensing devices 150a and 150b, the transmission transistor, and/or the charge storage 155 may be integrated for each pixel. For example, as shown in the drawing, the photo-sensing devices 150a and 150b may be included in each of a blue pixel and a red pixel and the charge storage 155 may be included in a green pixel.

The photo-sensing devices 150a and 150b may be configured to sense light and the sensed information may be transmitted by a transmission transistor, the charge storage 155 is electrically connected to the sensor 100, and information of the charge storage 155 may be transferred by the transmission transistor.

Metal wires (not shown) and pads (not shown) are formed on the semiconductor substrate 110. In order to decrease signal delay, the metal wires and pads may be made of a metal having low resistivity, for example, aluminum (Al), copper (Cu), silver (Ag), and alloys thereof, but are not limited thereto. However, the present disclosure is not limited to the above structure, and metal wires and pads may be disposed under the photo-sensing devices 150a and 150b.

A lower insulating layer 60 is formed on the metal wires and the pads. The lower insulating layer 60 may be made of an inorganic insulating material such as a silicon oxide and/or a silicon nitride, or a low dielectric constant (low K) material such as SiC, SiCOH, SiCO, and SiOF. The lower insulating layer 60 has a trench exposing the charge storage 155. The trench may be filled with filler.

A color filter layer 70 is formed on the lower insulating layer 60. The color filter layer 70 includes a blue filter 70a in a blue pixel and a red filter 70b in a red pixel. However, the present disclosure is not limited thereto, and a cyan filter, a magenta filter, and/or a yellow filter may be included instead or additionally. In some example embodiments, including the example embodiments shown in at least FIGS. 5-6, an example in which a green filter is not provided is described, but in some cases, a green filter may be provided.

The upper insulating layer 80 is formed on the color filter layer 70. The upper insulating layer 80 may remove steps caused by the color filter layer 70 and planarize. The upper insulating layer 80 and the lower insulating layer 60 have a contact hole (not shown) exposing the pads and a trench 85 exposing the charge storage 155 of the green pixel.

The aforementioned sensor 100 is formed on the upper insulating layer 80. The sensor 100 may have a structure shown in FIG. 1 or 3, and detailed description is as described above. One of the first electrode 10 or the second electrode 20 of the sensor 100 may be a light-receiving electrode, and the other of the first electrode 10 and the second electrode 20 of the sensor 100 may be connected to the charge storage 155. For example, the first electrode 10 of the sensor 100 may be a light-receiving electrode and the second electrode 20 of the sensor 100 may be connected to the charge storage 155. For example, the second electrode 20 of the sensor 100 may be a light-receiving electrode, and the first electrode 10 of the sensor 100 may be connected to the charge storage 155. The sensor 100 may include a photo-active layer 30 that includes a light-absorbing semiconductor that is configured to absorb light (e.g., at least a portion of incident light 900) in a first wavelength spectrum that is one of a blue wavelength spectrum, a green wavelength spectrum, or a red wavelength spectrum, and at least one of the first photo-sensing device 150*a* or the second photo-sensing device 150*b* may be configured to sense light (e.g., at least a portion of incident light 900) in a second wavelength spectrum that is one of the blue wavelength spectrum, the green wavelength spectrum, or the red wavelength spectrum, wherein the first wavelength spectrum and the second wavelength spectrum are different from each other. At least one other of the first photo-sensing device 150*a* or the second photo-sensing device 150*b* may be configured to sense light (e.g., at least a portion of incident light 900) in a third wavelength spectrum that is one of the blue wavelength spectrum, the green wavelength spectrum, or the red wavelength spectrum, wherein the third wavelength spectrum is different from both the first wavelength spectrum and the second wavelength spectrum. For example, the sensor 100 may include a photo-active layer 30 that includes a light-absorbing semiconductor that is configured to absorb green light (e.g., a green wavelength spectrum), the first photo-sensing device 150*a* may be configured to absorb blue light (e.g., a blue wavelength spectrum) and the second photo-sensing device 150*b* may be configured to absorb red light (e.g., a red wavelength spectrum). In some example embodiments, the color filter layer 70 may be absence from the sensor 400, and the photo-sensing devices 150*a* and 150*b* may each be configured to absorb a particular wavelength spectrum independently of the color filter layer 70 (e.g., in the absence of the color filter layer 70). In some example embodiments, the photo-sensing devices 150*a* and 150*b* may be configured to absorb light that passes through a particular color filter 70*a* or 70*b* overlapping the photo-sensing device 150*a* or 150*b* in the direction extending perpendicular to the upper surface 110*a* of the semiconductor substrate 110.

A focusing lens (not shown) may be further formed on the sensor 100. The focusing lens may control direction of incident light and gather the light in one region. The focusing lens may have a shape of, for example, a cylinder or a hemisphere, but is not limited thereto.

Figure 7:
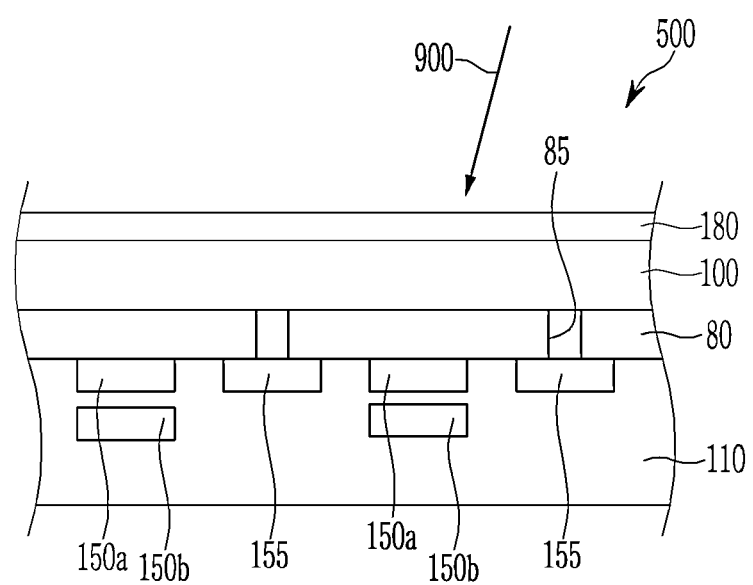
FIG. 7 is a cross-sectional view showing another example of the image sensor of FIG. 5 according to some example embodiments.

FIG. 7 is a cross-sectional view showing another example of the image sensor of FIG. 5 according to some example embodiments.

Referring to FIG. 7, an image sensor 500 according to some example embodiments includes a semiconductor substrate 110 in which photo-sensing devices 150*a* and 150*b*, a transmission transistor (not shown) and a charge storage 155 are integrated, an insulating layer 80, and a sensor 100 as in some example embodiments, including the example embodiments shown in at least FIGS. 5-6. The sensor 100 may include a photo-active layer 30 that includes a light-absorbing semiconductor that is configured to absorb light (e.g., at least a portion of incident light 900) in a first wavelength spectrum that is one of a blue wavelength spectrum, a green wavelength spectrum, or a red wavelength spectrum, and at least one of the first photo-sensing device 150*a* or the second photo-sensing device 150*b* may be configured to sense light (e.g., at least a portion of incident light 900) in a second wavelength spectrum that is one of the blue wavelength spectrum, the green wavelength spectrum, or the red wavelength spectrum, wherein the first wavelength spectrum and the second wavelength spectrum are different from each other. For example, the sensor 100 may include a photo-active layer 30 that includes a light-absorbing semiconductor that is configured to absorb green light (e.g., a green wavelength spectrum), the first photo-sensing device 150*a* may be configured to absorb blue light (e.g., a blue wavelength spectrum) and the second photo-sensing device 150*b* may be configured to absorb red light (e.g., a red wavelength spectrum).

However, in the image sensor 500 according to some example embodiments, including the example embodiments shown in at least FIG. 7, unlike some example embodiments, including the example embodiments shown in at least FIGS. 5-6, the photo-sensing devices 150*a* and 150*b* are stacked in a vertical direction (e.g., the direction extending perpendicular to the upper surface 110*a* of the semiconductor substrate 110), and the color filter layer 70 is omitted. The photo-sensing devices 150*a* and 150*b* are electrically connected to a charge storage (not shown) and may be transferred by a transmission transistor. The photo-sensing devices 150*a* and 150*b* may selectively absorb light in each wavelength spectrum according to the stacking depth.

The sensor 100 may have a structure shown in FIG. 1 or 3, and detailed description is as described above. One of the first electrode 10 or the second electrode 20 of the sensor 100 may be a light-receiving electrode, and the other of the first electrode 10 and the second electrode 20 of the sensor 100 may be connected to the charge storage 155. For example, the first electrode 10 of the sensor 100 may be a light-receiving electrode and the second electrode 20 of the sensor 100 may be connected to the charge storage 155. For example, the second electrode 20 of the sensor 100 may be a light-receiving electrode, and the first electrode 10 of the sensor 100 may be connected to the charge storage 155.

Figure 8:
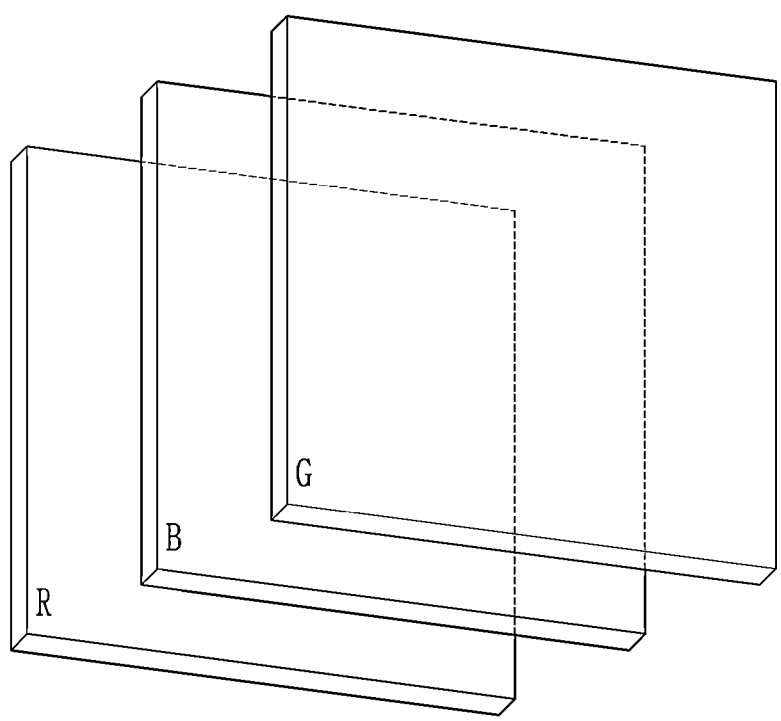
FIG. 8 is a top plan view of another example of an image sensor according to some example embodiments.
Figure 9:
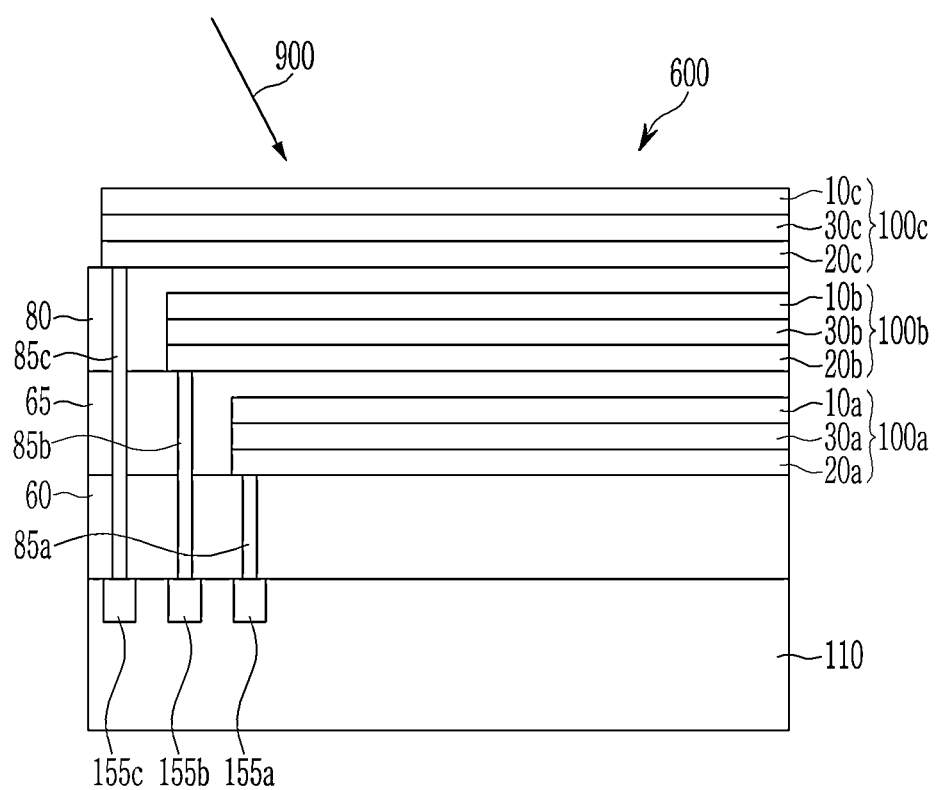
FIG. 9 is a cross-sectional view showing an example of the image sensor of FIG. 8 according to some example embodiments.

FIG. 8 is a top plan view of another example of an image sensor according to some example embodiments and FIG. 9 is a cross-sectional view showing an example of the image sensor of FIG. 8.

The image sensor 600 according to some example embodiments have a structure in which a green device configured to selectively absorb light in a green wavelength spectrum, a blue device configured to selectively absorb light in a blue wavelength spectrum, and a red device configured to selectively absorb light in a red wavelength spectrum are stacked.

The image sensor 600 according to some example embodiments includes a semiconductor substrate 110, a lower insulating layer 60, an intermediate insulating layer 65, an upper insulating layer 80, a first sensor 100*a*, and a second sensor 100*b*, and the third sensor 100*c*.

The semiconductor substrate 110 may be a silicon substrate, and a transmission transistor (not shown) and charge storages 155*a*, 155*b*, and 155*c* are integrated therein.

Metal wires (not shown) and pads (not shown) are formed on the semiconductor substrate 110, and the lower insulating layer 60 is formed on the metal wires and the pads.

The first sensor 100*a*, the second sensor 100*b*, and the third sensor 100*c* are sequentially formed on the lower insulating layer 60.

The first, second, and third sensors 100*a*, 100*b*, and 100*c* may each independently have the structures shown in FIG. 1 or 3, and detailed descriptions are as described above. The first, second, and third sensors 100*a*, 100*b*, and 100*c* may have same or different structures and/or material compositions thereof. One of the first electrode 10 or the second electrode 20 of the first, second, and third sensors 100*a*, 100*b*, and 100*c* may be a light-receiving electrode, and the other of the first electrode 10 and the second electrode 20 of the first, second, and third sensors 100*a*, 100*b*, and 100*c* may be connected to the charge storages 155*a*, 155*b*, and 155*c*. For example, the first electrodes 10*a*, 10*b*, and 10*c* of the first, second, and third sensors 100*a*, 100*b*, and 100*c* may be light-receiving electrodes and the second electrodes 20*a*, 20*b*, and 20*c* of the first, second, and third sensors 100*a*, 100*b*, and 100*c* may be connected to the charge storage 155. For example, the second electrodes 20*a*, 20*b*, and 20*c* of the first, second, and third sensors 100*a*, 100*b*, and 100*c* may be light-receiving electrodes and the first electrodes 10*a*, 10*b*, and 10*c* of the first, second, and third sensors 100*a*, 100*b*, and 100*c* may be connected to the charge storage 155.

The photo-active layer 30*ac* of the first sensor 100*a* may selectively absorb light in a wavelength spectrum of one of red, blue, or green, thereby inducing interfacial band bending of the Schottky junction and charge carriers may be transferred from the first electrode 10*a* to the second electrode 20*a* by application of an external bias (e.g., a voltage bias applied between the first electrode 10*a* and the second electrode 20*a*). For example, the first sensor 100*a* may be a red device configured to absorb light in a red wavelength spectrum. The intermediate insulating layer 65 is formed on the first sensor 100*a*.

The second sensor 100*b* is formed on the intermediate insulating layer 65.

The photo-active layer 30*b* of the second sensor 100*b* may be configured to selectively absorb light in a wavelength spectrum of one of red, blue, or green, thereby inducing interfacial band bending of the Schottky junction and charge carriers may be transferred from the first electrode 10*b* to the second electrode 20*b* by application of an external bias (e.g., a voltage bias applied between the first electrode 10*b* and the second electrode 20*b*). For example, the second sensor 100*b* may be a blue device configured to absorb light in a blue wavelength spectrum.

The upper insulating layer 80 is formed on the second sensor 100*b*. The lower insulating layer 60, the intermediate insulating layer 65, and the upper insulating layer 80 have a plurality of trenches 85*a*, 85*b*, and 85*c* exposing the charge storages 155*a*, 155*b*, and 155*c*.

The third sensor 100*c* is formed on the upper insulating layer 80.

The photo-active layer 30*c* of the third sensor 100*c* may be configured to selectively absorb light in a wavelength spectrum of one of red, blue, or green thereby inducing interfacial band bending of the Schottky junction and charge carriers may be transferred from the first electrode 10*c* to the second electrode 20*c* by application of an external bias (e.g., a voltage bias applied between the first electrode 10*c* and the second electrode 20*c*). For example, the third sensor 100*c* may be a green device configured to absorb light in a green wavelength spectrum.

A focusing lens (not shown) may be further formed on the third sensor 100*c*. The focusing lens may control direction of incident light and gather the light in one region. The focusing lens may have a shape of, for example, a cylinder or a hemisphere, but is not limited thereto.

In the drawing, a structure in which the first sensor 100*a*, the second sensor 100*b*, and the third sensor 100*c* are sequentially stacked is shown, but is not limited thereto, and the stacking order may be variously changed.

As described above, the first sensor 100*a*, the second sensor 100*b*, and the third sensor 100*c* configured to absorb light in different wavelength spectra have a stacked structure, further reducing a size of the image sensor and implementing a down-sized image sensor.

Figure 10:
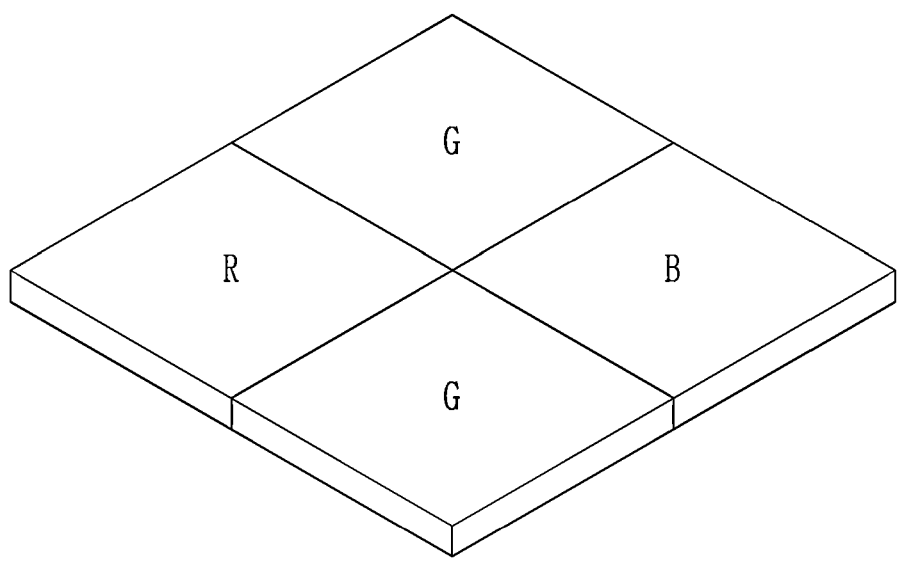
FIG. 10 is a top plan view showing another example of an image sensor according to some example embodiments.
Figure 11:
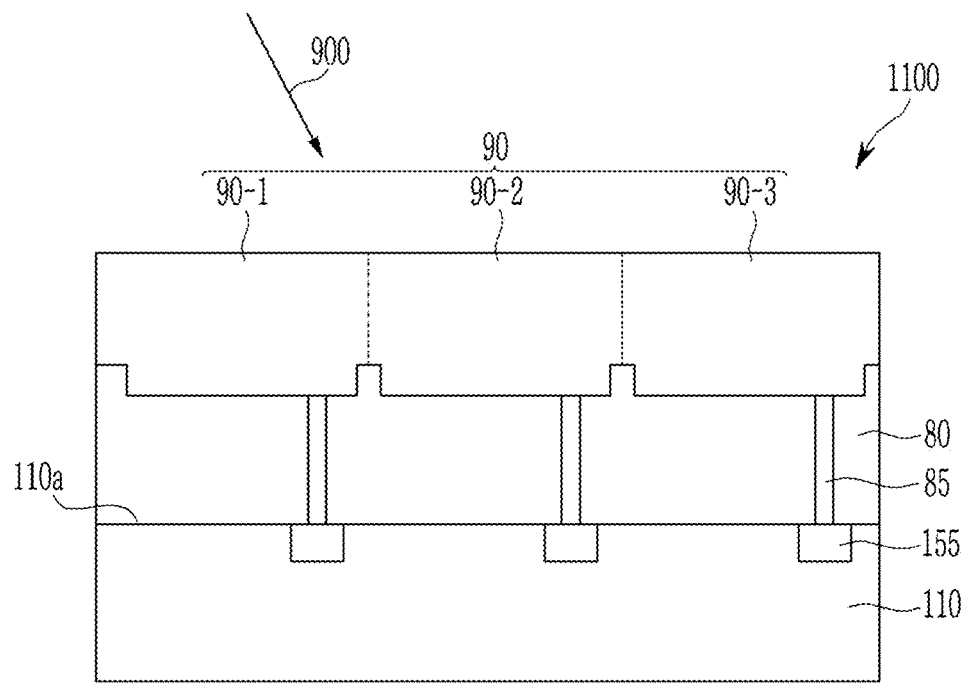
FIG. 11 is a cross-sectional view showing an example of the image sensor of FIG. 10 according to some example embodiments.

FIG. 10 is a top plan view showing another example of an image sensor according to some example embodiments and FIG. 11 is a cross-sectional view showing an example of the image sensor of FIG. 10.

Referring to FIGS. 10 and 11, an image sensor 1100 includes a device 90 on the semiconductor substrate 110, and the device 90 includes a plurality of devices 90-1, 90-2, and 90-3. The plurality of devices 90-1, 90-2, and 90-3 may be configured to absorb light (e.g., blue light, green light, or red light) of different wavelength spectra. Referring to FIG. 11, a plurality of devices 90-1, 90-2, and 90-3 are arranged in parallel on the semiconductor substrate 110 in a horizontal direction and may be partially or totally overlapped with each other in a direction extending parallel to the upper surface 110*a* of the semiconductor substrate 110. Each device 90-1, 90-2, and 90-3 is connected to the charge storage 155 integrated in the semiconductor substrate 110 through the trench 85.

Each device 90-1, 90-2, and 90-3 may be the aforementioned sensor 100. For example, two or more devices 90-1, 90-2, and 90-3 may include different portions of a common continuous layer extending continuously between the devices 90-1, 90-2, and 90-3. For example, the plurality of devices 90-1, 90-2, and 90-3 may share the common first electrode 10 and/or the common second electrode 20. For example, two or more devices 90-1, 90-2, and 90-3 may have different photo-active layers 30 configured to absorb light in different wavelength spectra of incident light. Other structures of the image sensor 1100 may be the same as one or more of the image sensors described with reference to FIGS. 4 to 9.

Figure 12:
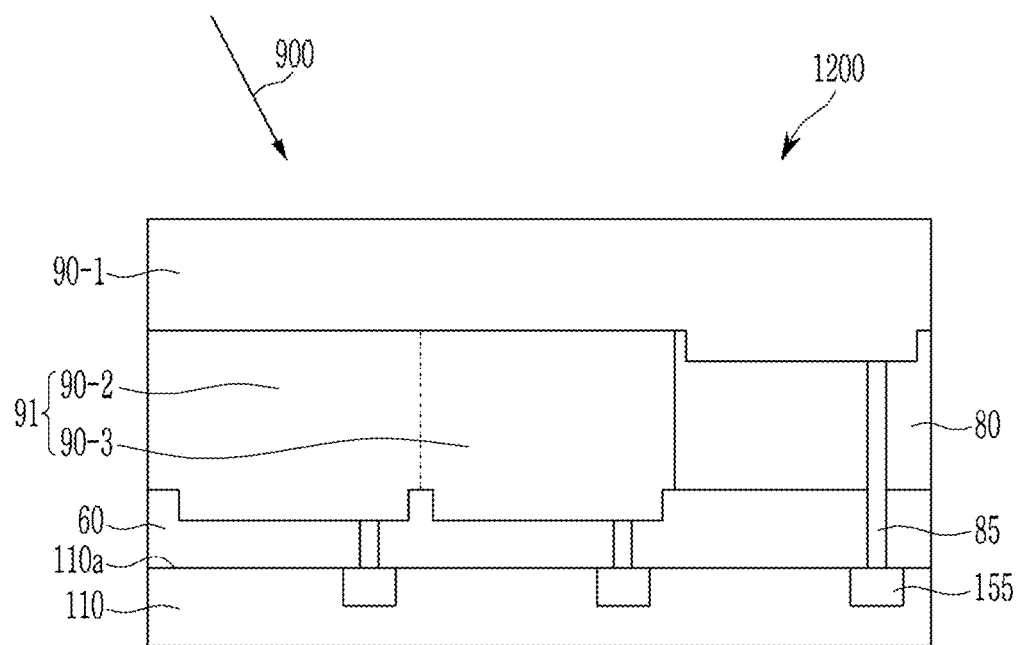
FIG. 12 is a cross-sectional view showing an example of an image sensor according to some example embodiments.

FIG. 12 is a cross-sectional view showing an example of an image sensor according to some example embodiments.

Referring to FIG. 12, an image sensor 1200 includes a semiconductor substrate 110 and devices 90-1 and 91 stacked on the semiconductor substrate 110. The device 91 includes a plurality of devices 90-2 and 90-3, and the plurality of devices 90-2 and 90-3 may be arranged to be overlapped with each other in a direction extending parallel to the upper surface 110*a* of the semiconductor substrate 110. The plurality of devices 90-1, 90-2, and 90-3 may be configured to absorb light (e.g., blue light, green light, or red light) of different wavelength spectra.

As an example, the device 91 may include a plurality of horizontally arranged devices configured to absorb light in different wavelength spectra. As an example, the device 90-1 may be configured to absorb light in one wavelength spectrum selected from blue light, green light, and red light. As an example, the device 91 may be totally or partially overlapped with the device 90-1. Other structures of the image sensor 1200 may be the same as one or more of the image sensors described with reference to FIGS. 4 to 9.

Figure 13:
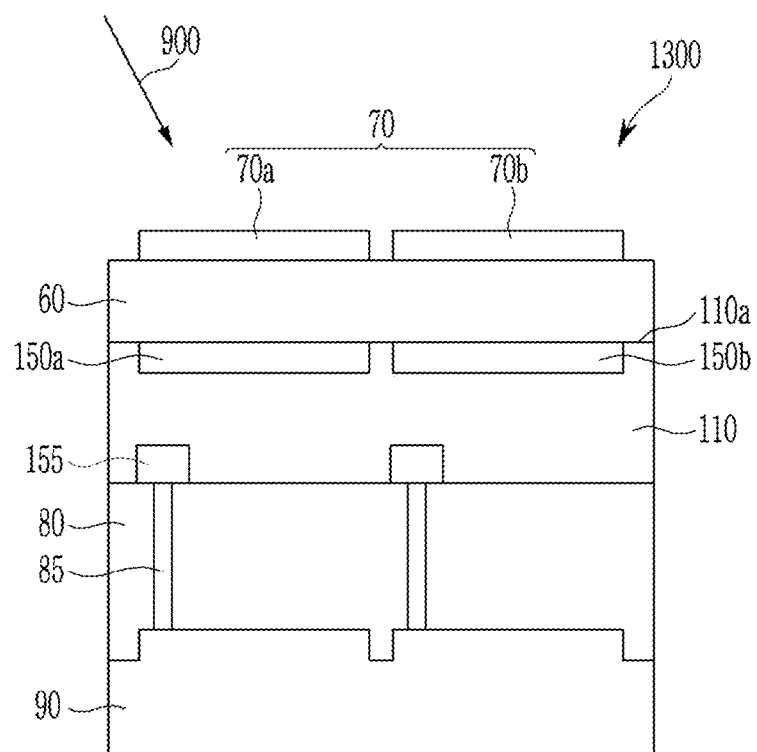
FIG. 13 is a cross-sectional view showing another example of an image sensor according to some example embodiments.

FIG. 13 is a cross-sectional view showing another example of an image sensor according to some example embodiments.

Referring to FIG. 13, an image sensor 1300 includes a semiconductor substrate 110 in which the photo-sensing devices 150*a* and 150*b*, the transmission transistor (not shown), and the charge storage 155 are integrated; an upper insulating layer 80, and a color filter layer 70 on the semiconductor substrate 110; a lower insulating layer 60, and a device 90 under the semiconductor substrate 110. The device 90 may be the aforementioned sensor 100. In FIG. 13, the device 90 is disposed under the semiconductor substrate 110, so that the device 90 and the color filter layer 70 are separated from the photo-sensing devices 150*a* and 150*b*. Other structures of the image sensor 1300 may be the same as one or more of the image sensors described with reference to FIGS. 4 to 9.

The sensors as described herein, including any of the sensors 100, 300, 400, 500, 600, 1100, 1200, 1300, and/or any combination thereof, including any of the example embodiments of a sensor 100 including first and second electrodes 10 and 20 and photo-active layer 30 according to any of the example embodiments.

The aforementioned devices and sensors may be applied to various electronic devices, for example, but not limited to, mobile phones, camera modules (also referred to herein as cameras), security cameras, biometric devices, medical devices, and/or automotive electronic components.

Figure 14:
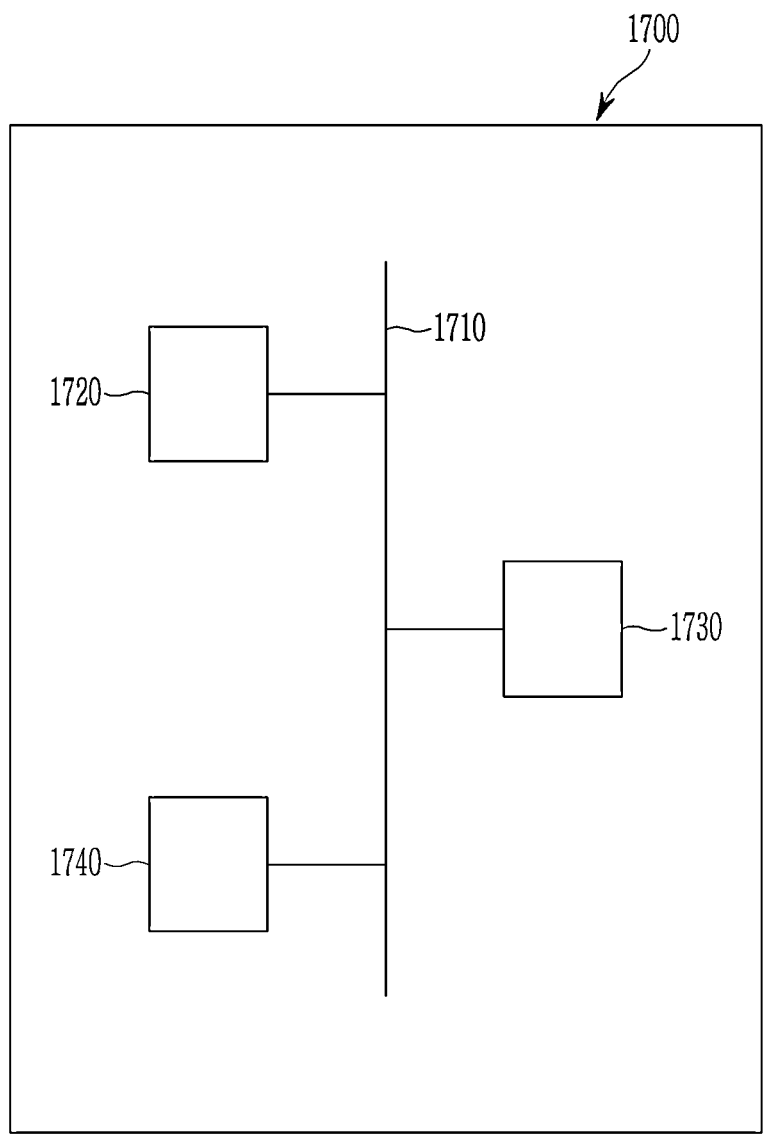
FIG. 14 is a schematic diagram of an electronic device according to some example embodiments.

FIG. 14 is a schematic diagram of an electronic device according to some example embodiments.

Referring to FIG. 14, the electronic device 1700 may include a processor 1720, a memory 1730, and an image sensor 1740 which are electrically connected to each other through a bus 1710. The image sensor 1740 may include any one of the sensors and/or devices according to any of the example embodiments (e.g., any of the sensors 100, 300, 400, 500, 600, 1100, 1200, 1300, and/or any combination thereof, according to any of the example embodiments). In some example embodiments the image sensor 1740 may be a camera that includes any one of the sensors and/or devices according to any of the example embodiments. The memory 1730, which is a non-transitory computer-readable medium, may store an instruction program. The processor 1720 may execute a stored instruction program to perform one or more functions. As an example, the processor 1720 may process the electric signal generated by the image sensor. The processor 1720 may generate output (e.g., an image to be displayed on the display interface) based on such processing.

The memory 1730 may be a non-transitory computer readable medium and may store a program of instructions. The memory 1730 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1720 may execute the stored program of instructions to perform one or more functions. For example, the processor 1720 may be configured to process electrical signals generated by the image sensor 1740. The processor 1720 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1720 may be configured to generate an output (e.g., an electrical signal) and/or process an output from the image sensor 1740 (e.g., an electrical signal transmitted based on charge carriers transferred to a second electrode of the image sensor 1740) based on such processing.

Figure 18:
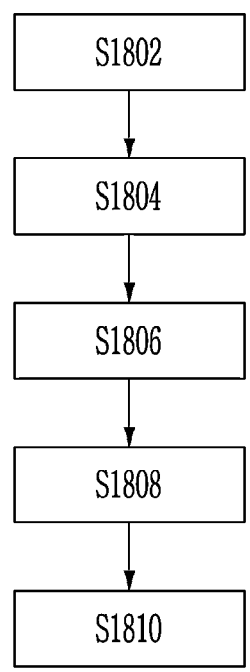
FIG. 18 is a flowchart illustrating a method of operating a sensor according to some example embodiments.

FIG. 18 is a flowchart illustrating a method of operating a sensor according to some example embodiments. The method may be performed with regard to a sensor according to any of the example embodiments, including a sensor that includes a first electrode 10, a second electrode 20, and a photo-active layer 30 between the first and second electrodes 10 and 20, the photo-active layer 30 including a light absorbing semiconductor according to any of the example embodiments.

At S1802, incident light (e.g., incident light 900) may enter the sensor (e.g., a sensor including sensor 100 according to any of the example embodiments) and may enter the photo-active layer 30 of the sensor such that the photo-active layer 30 may absorb at least a portion of the incident light to generate photo-generated charge carriers as described herein according to any of the example embodiments.

At S1804, the photo-active layer 30 may capture at least some or all of the photo-generated charge carriers (that are generated at S1802) at a charge carrier trapping site 30a in the photo-active layer 30, where the charge carrier trapping site 30a may be any charge carrier trapping site according to any of the example embodiments.

At S1806, the sensor may induce interfacial band bending of a Schottky junction between the first electrode 10 and the photo-active layer 30, where said interfacial band bending is induced based on, or by, the captured photo-generated charge carriers (that are captured at S1804). Restated, the sensor may cause the captured photo-generated charge carriers to induce interfacial band bending of a Schottky junction between the first electrode 10 and the photo-active layer 30 at S1806. Said interfacial band bending may be induced as described herein according to any of the example embodiments. In some example embodiments, the photo-generated charge carriers generated at S1802 serve as a switch to induce the interfacial band bending of the Schottky junction.

At S1808, a bias (also referred to herein as a voltage bias, voltage difference, or the like) may be applied between the first electrode 10 and the second electrode 20 to cause the sensor to transfer charge carriers from the first electrode 10 to the second electrode 20 via the photo-active layer 30, according to any of the example embodiments. For example a first voltage (e.g., 0 MV/cm, 0.1 MV/cm, 0.2 MV/cm, 0.5 MV/cm, etc.) may be applied to the first electrode 10 and a second voltage that may be different from the first voltage (e.g., 0 MV/cm, 0.1 MV/cm, 0.2 MV/cm, 0.5 MV/cm, etc.) may be applied to the second electrode 20, where the voltage difference (e.g., bias) is applied between the first and second electrodes 10 and 20, and where said bias causes charge carriers to be transferred from the first electrode 10 to the second electrode 20 via the photo-active layer 30 according to any of the example embodiments. Said applied bias may be greater than about 0 MV/cm and less than or equal to about 0.5 MV/cm. The quantity of the charge carriers transferred to the second electrode may be greater than a quantity of the photo-generated charge carriers generated at S1802 based on the photo-active layer absorbing the incident light. In some example embodiments, the external quantum efficiency (EQE) of the sensor may exceed about 100%.

At S1810, an electrical signal transmitted to the second electrode 20 is read according to any of the example embodiments. For example, the transferred charge carriers that are transferred to, and arrive at, the second electrode 20, may define an electrical signal transmitted to the second electrode 20 and may be output from the second electrode (e.g., to processing circuitry according to any example embodiments) as an electrical signal that is transmitted to the second electrode and is read from the sensor. The electrical signal transmitted to the second electrode may not include (e.g., may exclude) an electrical signal by the photo-generated charge carriers. For example, the electrical signal may entirely comprise charge carriers transferred to the second electrode 20.

Hereinafter, some example embodiments are illustrated in more detail with reference to examples. However, the present scope of the inventive concepts is not limited to the following examples.

Manufacture of Devices

EXAMPLE 1

ITO (WF: 4.7 eV) is sputtered on a glass substrate to form an about 150 nm-thick lower electrode. Subsequently, a compound represented by Chemical Formula 1 is deposited on the lower electrode to form a 5 nm-thick buffer layer. Then, a p-type semiconductor represented by Chemical Formula 2 ($\lambda_{max}$=555 nm) is deposited on the buffer layer to form a 400 nm-thick photo-active layer. ITO is sputtered on the photo-active layer to form a 28 nm-thick upper electrode, thereby manufacturing a Schottky-type device.

Evaluation I

The external quantum efficiency (EQE) according to the external electric field of the devices according to Examples and Reference Examples are evaluated.

The external quantum efficiency (EQE) is evaluated by reading the current values generated by light from the devices by modulating the wavelength of light while applying a voltage between the lower and upper electrodes.

Figure 15:
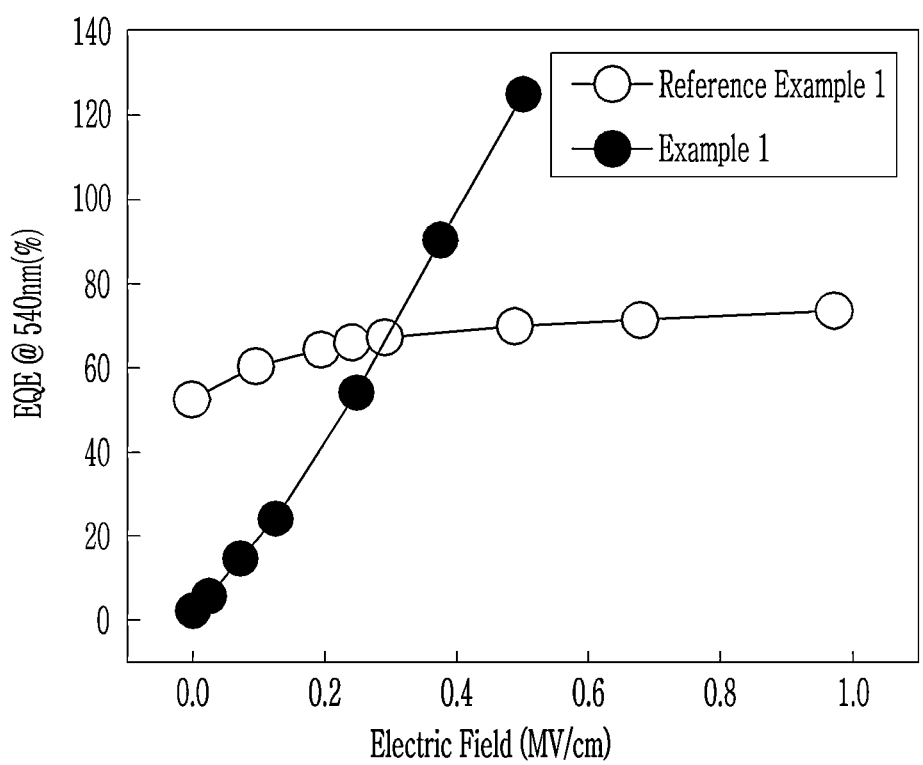
FIG. 15 is a graph showing changes in the external quantum efficiency (EQE) according to the electric field of the devices according to Example 1 and Reference Example 1.
Figure 16:
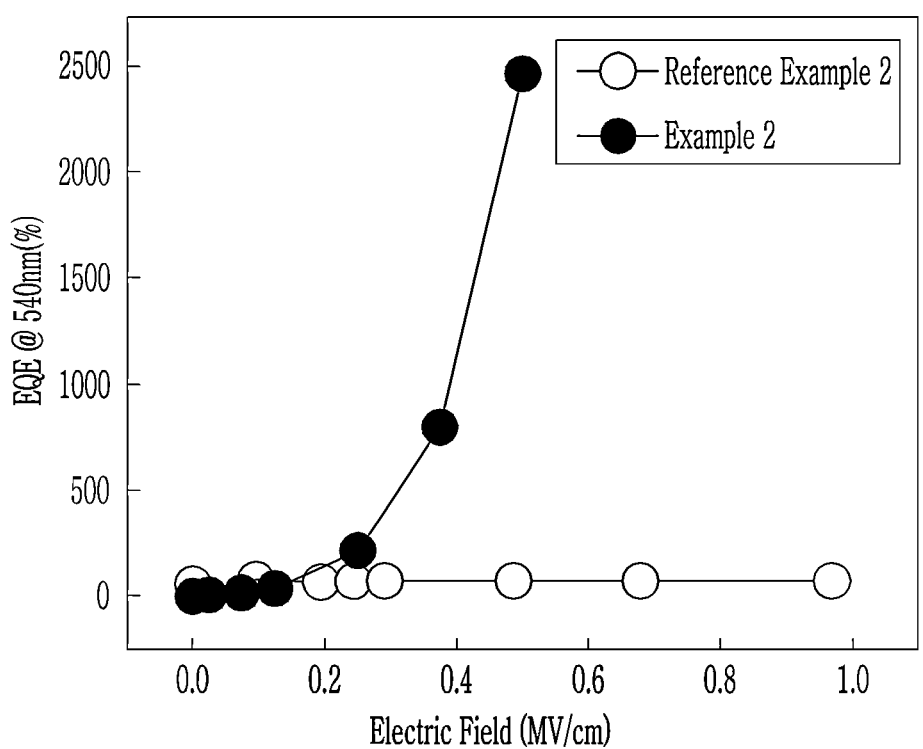
FIG. 16 is a graph showing changes in the external quantum efficiency (EQE) according to the electric field of the devices according to Example 2 and Reference Example 2 according to some example embodiments.

The results are shown in Tables 1 and 2 and FIGS. 15 and 16.

FIG. 15 is a graph showing changes in the external quantum efficiency (EQE) according to the electric field of the devices according to Example 1 and Reference Example 1 according to some example embodiments and FIG. 16 is a graph showing changes in the external quantum efficiency

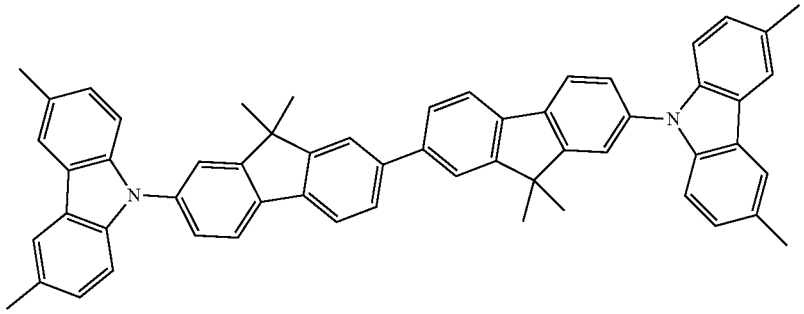

[Chemical Formula 1]

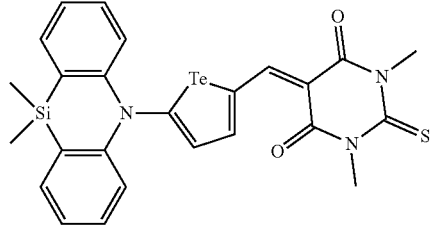

[Chemical Formula 2]

EXAMPLE 2

A Schottky-type device is manufactured in the same manner as in Example 1, except that Al is deposited on the photo-active layer instead ITO to form an 80 nm-thick upper electrode.

Reference Example 1

ITO (WF: 4.7 eV) is sputtered on a glass substrate to form an about 150 nm-thick lower electrode. Subsequently, a compound represented by Chemical Formula 1 is deposited on the lower electrode to form a 5 nm-thick buffer layer. Then, a p-type semiconductor represented by Chemical Formula 2 ($\lambda_{max}$=555 nm) and an n-type semiconductor, fullerene (C60), are co-deposited on the buffer layer to form a 400 nm-thick photo-active layer. ITO is sputtered on the photo-active layer to form a 28 nm-thick upper electrode, thereby manufacturing a pn junction type device.

Reference Example 2

A pn junction type device is manufactured in the same manner as in Reference Example 1, except that Al is deposited on the photo-active layer instead ITO to form an 80 nm-thick upper electrode.

(EQE) according to the electric field of the devices according to Example 2 and Reference Example 2 according to some example embodiments.

TABLE 1

| | EQE (@540 nm, 0.5 MV/cm) (%) |
|---|---|
| Example 1 | 125 |
| Reference Example 1 | 70 |

TABLE 2

| | EQE (@540 nm, 0.5 MV/cm) (%) |
|---|---|
| Example 2 | 2468 |
| Reference Example 2 | 70 |

Referring to Tables 1 and 2 and FIGS. 15 and 16, the external quantum efficiency (EQE) of the device according to Examples increases as the electric field increases and is also significantly higher than the external quantum efficiency (EQE) of the device according to the Reference Examples at a particular (or, alternatively, predetermined)

electric field or higher (about 0.3 MV/cm or higher). In particular, the device according to Examples may realize external quantum efficiency (EQE) of more than 100% at a particular (or, alternatively, predetermined) electric field or higher.

Evaluation II

The external quantum efficiency (EQE) according to the wavelength of the device according to Example 1 is evaluated.

Figure 17:
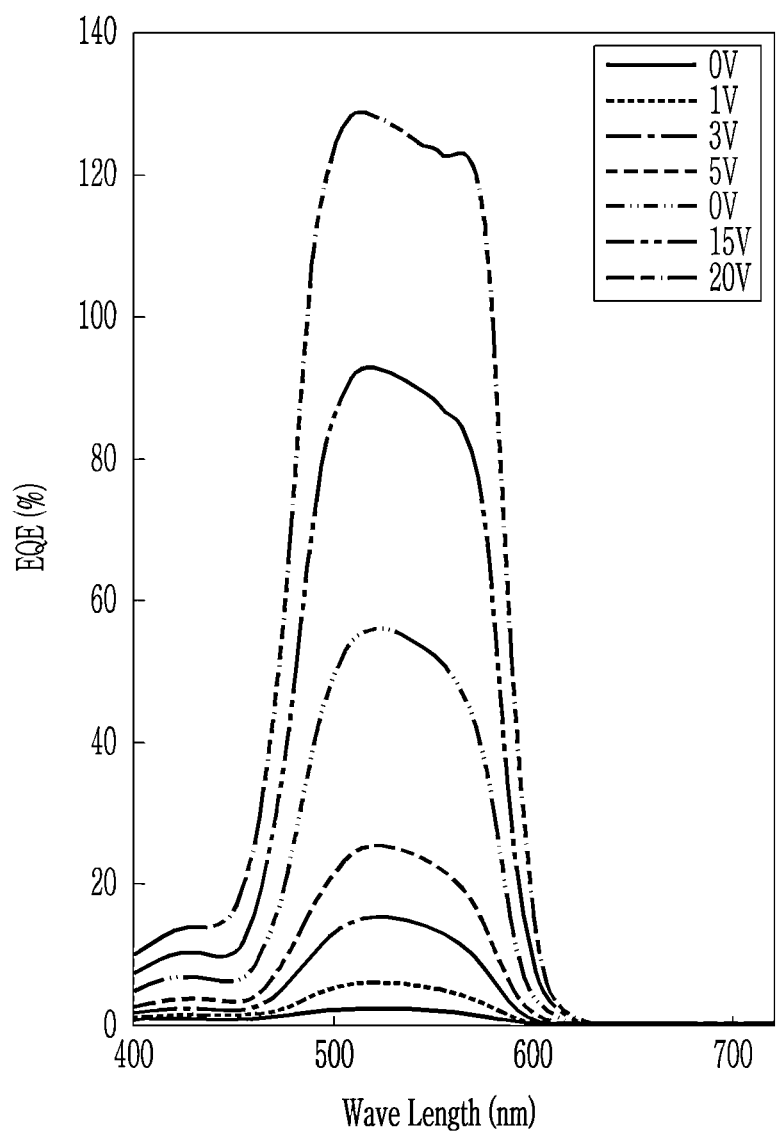
FIG. 17 is a graph showing external quantum efficiency (EQE) according to the wavelength of the device according to Example 1 according to some example embodiments.

FIG. 17 is a graph showing external quantum efficiency (EQE) according to the wavelength of the device according to Example 1 according to some example embodiments.

Referring to FIG. 17, the device according to Example 1 shows changes of the external quantum efficiency (EQE) according to the applied voltage and external quantum efficiency (EQE) of more than 100% may be realized in a green wavelength spectrum of about 500 nm to 600 nm when about 20 V is applied.

Evaluation III

Leakage current characteristics of the devices according to Examples and Reference Examples are evaluated.

Leakage current is evaluated by applying a reverse bias to the device under dark conditions, reading the current value at −3V or −20V, and unit-changing the current value into the number of electrons per square.

Table 3 shows the results.

TABLE 3

|  | Dark Current (e/s, @3 V) | Dark Current (e/s, @20 V) |
| --- | --- | --- |
| Example 2 | 0.8 | $1.7 \times 10^3$ |
| Reference Example 2 | 1.5 | $5.4 \times 10^3$ |

Referring to Table 3, the device according to Example has a low leakage current compared with the device according to the Reference Example.

Evaluation IV

Detectivity of the devices according to Examples and Reference Examples is evaluated.

The detectivity is obtained by dividing an amount of incident light by a photocurrent and then dividing the resulting value by a dark current that is a noise.

The results are shown in Tables 4 and 5.

TABLE 4

|  | Detectivity (Jones, @540 nm, @3 V) | Detectivity (Jones, @540 nm, @20 V) |
| --- | --- | --- |
| Example 1 | $2.9 \times 10^{12}$ | $4.7 \times 10^{12}$ |
| Reference Example 1 | $1.8 \times 10^{12}$ | $1.3 \times 10^{12}$ |

TABLE 5

|  | Detectivity (Jones, @540 nm, @3 V) | Detectivity (Jones, @540 nm, @20 V) |
| --- | --- | --- |
| Example 2 | $5.9 \times 10^{12}$ | $1.1 \times 10^{14}$ |
| Reference Example 2 | $1.4 \times 10^{12}$ | $1.5 \times 10^{12}$ |

Referring to Tables 4 and 5, the devices according to Examples exhibit improved detectivity compared to the device according to Reference Example.

Evaluation V

Image sensors of FIGS. 5 and 6 (Structure I, pixel size=1.12 μm) to which the devices according to Example 1 and Reference Example 1 are applied, and image sensors of FIG. 4 to which the devices according to Example 2 and Reference Example 2 are applied (Structure II, pixel size=1.4 μm) are designed and YSNR10 of the image sensors are evaluated.

The YSNR10 of the image sensor is a minimum light amount (unit: lux) in which a ratio of signal to noise (signal/noise) becomes 10, wherein the signal is a signal sensitivity obtained by performing a RGB raw signal calculated by a FDTD (finite difference time domain method) with a color correction step through a color correction matrix (CCM), and the noise is a noise generated when measuring the signal in the image sensor. The color correction step is a step of reducing a difference from the real color by image-processing the RGB raw signal obtained from the image sensor. As the YSNR10 has the lower value, the image characteristics are getting the better in a low light amount.

The results are shown in Tables 6 and 7.

TABLE 6

|  | YSNR10 (lux) (Structure I) |
| --- | --- |
| Example 1 | 59 |
| Reference Example 1 | 75 |

TABLE 7

|  | YSNR10 (lux) (Structure II) |
| --- | --- |
| Example 2 | 47.2 |
| Reference Example 2 | 75 |

Referring to Tables 6 and 7, the image sensors applied with the device according to Examples have a lower YSNR10 compared with the image sensors applied with the devices according to Reference Examples, from which the sensitivity of the image sensors according to Examples may be improved.

While this disclosure has been described in connection with what is presently considered to be practical example embodiments, it is to be understood that the inventive concepts are not limited to the disclosed example embodiments. On the contrary, the inventive concepts are intended to cover various modifications and equivalent arrangements included within the spirit and scope of the appended claims.

What is claimed is:

1. A sensor, comprising:
   a semiconductor substrate;
   a first electrode and a second electrode; and
   a photo-active layer between the first electrode and the second electrode, the photo-active layer including a light absorbing semiconductor,
   wherein the photo-active layer has a first surface that is proximate to the first electrode, and a second surface that is proximate to the second electrode, the second surface facing the first surface such that the first surface and the second surface are opposite surfaces of the photo-active layer,
   wherein the photo-active layer has a charge carrier trapping site configured to capture photo-generated charge carriers generated based on the light absorbing semiconductor absorbing incident light, and wherein the charge carrier trapping site is at least partially defined by the first surface of the photo-active layer and in a limited portion of the photo-active layer such that a thickness of the charge carrier trapping site, extending from the first surface of the photo-active layer in a direction extending perpendicular to the first surface of the photo-active layer, is less than about 50% of a total thickness of the photo-active layer from the first surface of the photo-active layer to the second surface of the photo-active layer, wherein the semiconductor substrate includes a charge storage electrically connected to the second electrode.

2. The sensor of claim 1, wherein the sensor is configured to have an external quantum efficiency (EQE) that is proportional to a magnitude of a voltage bias applied between the first electrode and the second electrode, such that as the voltage bias between the first electrode and the second electrode becomes larger, the external quantum efficiency (EQE) of the sensor becomes higher.

3. The sensor of claim 2, wherein the voltage bias applied between the first electrode and the second electrode is greater than about 0 MV/cm and less than or equal to about 0.5 MV/cm.

4. The sensor of claim 2, wherein the external quantum efficiency (EQE) of the sensor exceeds about 100%.

5. The sensor of claim 1, wherein the light absorbing semiconductor is included in about 90% to about 100% based on a total volume of the photo-active layer, such that about 90% to about 100% of the total volume of the photo-active layer is the light absorbing semiconductor.

6. The sensor of claim 1, wherein a thickness of the photo-active layer is equal to or greater than about 100 nm and less than or equal to about 3 μm.

7. The sensor of claim 1, wherein a surface roughness of the first surface of the photo-active layer is between about 0 nm and about 10 nm.

8. The sensor of claim 1, wherein
the sensor is configured to cause the photo-generated charge carriers to serve as a switching to induce interfacial band bending of a Schottky junction,
the sensor is configured to cause charge carriers to be transferred from the first electrode to the second electrode based on a voltage bias applied between the first electrode and the second electrode, and
the sensor is configured to cause a quantity of charge carriers transferred from the first electrode to the second electrode to be greater than a quantity of the photo-generated charge carriers that are generated based on the light absorbing semiconductor absorbing the incident light, based on the incident light entering at least the photo-active layer.

9. The sensor of claim 1, further comprising a buffer layer between the photo-active layer and the second electrode.

10. The sensor of claim 1, further comprising a color filter layer on the semiconductor substrate, the color filter layer at least partially overlapping the photo-active layer in a direction extending perpendicular to an upper surface of the semiconductor substrate.

11. The sensor of claim 1, wherein
the semiconductor substrate further comprises a first photodiode and a second photodiode, the second photodiode being stacked with the first photodiode in the semiconductor substrate in a direction extending perpendicular or parallel to an upper surface of the semiconductor substrate,
the light absorbing semiconductor is configured to absorb light in a first wavelength spectrum that is one of a blue wavelength spectrum, a green wavelength spectrum, or a red wavelength spectrum,
the first photodiode is configured to sense light in a second wavelength spectrum that is one of the blue wavelength spectrum, the green wavelength spectrum, or the red wavelength spectrum, the second wavelength spectrum being different from the first wavelength spectrum, and
the second photodiode is configured to sense light in a third wavelength spectrum that is a further one of the blue wavelength spectrum, the green wavelength spectrum, or the red wavelength spectrum, the third wavelength spectrum being different from both the first wavelength spectrum and the second wavelength spectrum.

12. An electronic device comprising the sensor of claim 1.

13. A sensor, comprising:
a first electrode and a second electrode; and
a photo-active layer between the first electrode and the second electrode, the photo-active layer including a light absorbing semiconductor,
wherein the photo-active layer has a charge carrier trapping site configured to capture photo-generated charge carriers generated based on the light absorbing semiconductor absorbing incident light, and
wherein the light absorbing semiconductor includes one of a p-type non-polymeric semiconductor or an n-type non-polymeric semiconductor,
wherein the photo-active layer at least partially defines a mono-continuous phase including the one of the p-type non-polymeric semiconductor or the n-type non-polymeric semiconductor.

14. An electronic device comprising the sensor of claim 13.

15. A sensor, comprising:
a semiconductor substrate;
a first electrode and a second electrode; and
a photo-active layer between the first electrode and the second electrode, the photo-active layer including a light absorbing semiconductor,
wherein the photo-active layer has a charge carrier trapping site configured to capture photo-generated charge carriers generated based on the light absorbing semiconductor absorbing incident light, and
wherein the light absorbing semiconductor includes one of
a p-type monomer having a molecular weight of less than or equal to about 5000 Daltons and greater than 0 Daltons, or
an n-type monomer having a molecular weight of less than or equal to about 5000 Daltons and greater than 0 Daltons,
wherein the semiconductor substrate includes a charge storage electrically connected to the second electrode.

16. The sensor of claim 15, wherein the p-type monomer is an organic semiconductor including an electron donating moiety, a π-conjugated moiety, and an electron accepting moiety.

17. The sensor of claim 15, wherein the light absorbing semiconductor is configured to absorb light in at least one of a blue wavelength spectrum, a green wavelength spectrum, a red wavelength spectrum, or an infrared wavelength spectrum.

18. An electronic device comprising the sensor of claim 15.

* * * * *